(12) United States Patent
Yamaguchi et al.

(10) Patent No.: US 10,964,577 B2
(45) Date of Patent: Mar. 30, 2021

(54) ELECTROSTATIC CHUCK

(71) Applicant: TOTO LTD., Kitakyushu (JP)

(72) Inventors: Kosuke Yamaguchi, Kitakyushu (JP); Yuichi Yoshii, Kitakyushu (JP); Hitoshi Sasaki, Kitakyushu (JP); Kengo Maehata, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 336 days.

(21) Appl. No.: 16/131,818

(22) Filed: Sep. 14, 2018

(65) Prior Publication Data

US 2019/0013231 A1 Jan. 10, 2019

Related U.S. Application Data

(63) Continuation of application No. PCT/JP2017/018058, filed on May 12, 2017.

(30) Foreign Application Priority Data

May 13, 2016 (JP) .............................. JP2016-097287
Feb. 1, 2017 (JP) .............................. JP2017-016905
May 12, 2017 (JP) .............................. JP2017-095300

(51) Int. Cl.
*H01L 21/683* (2006.01)
*B23Q 3/15* (2006.01)
(Continued)

(52) U.S. Cl.
CPC ............ *H01L 21/6833* (2013.01); *B23Q 3/15* (2013.01); *H01L 21/67103* (2013.01); *H01L 21/67109* (2013.01); *H01L 21/67248* (2013.01); *H01L 21/6831* (2013.01); *H01L 21/6835* (2013.01); *H02N 13/00* (2013.01)

(58) Field of Classification Search
CPC ........... H01L 21/6833; H01L 21/67103; H01L 21/67109; H01L 21/67248; H01L 21/6831; H01L 21/6835; H02N 13/00; B23Q 3/15
See application file for complete search history.

(56) References Cited

U.S. PATENT DOCUMENTS 6,951,587 B1 * 10/2005 Narushima ......... C23C 16/4586
118/728
10,026,634 B2 * 7/2018 Takada .............. H01L 21/67109
(Continued)

FOREIGN PATENT DOCUMENTS

JP 2013-012616 A 1/2013
WO 2014/084334 A1 6/2014

*Primary Examiner* — Scott Bauer
(74) *Attorney, Agent, or Firm* — Carrier Blackman & Associates, P.C.; William D. Blackman; Joseph P. Carrier

(57) ABSTRACT

According to one embodiment, an electrostatic chuck includes a ceramic dielectric substrate having a first major surface placing an object to be processed and a second major surface on an opposite side of the first major surface, and a base plate provided on a side of the second major surface and supporting the ceramic dielectric substrate. The base plate includes a first communicating passage passing a medium which adjusts a temperature of the object to be processed. The first communicating passage has an upper surface, a side surface, and a lower surface. A ratio of variation of a maximum height Sz in the upper surface to a height of the first communicating passage is not more than 1%.

21 Claims, 11 Drawing Sheets

(51) Int. Cl.
*H01L 21/67* (2006.01)
*H02N 13/00* (2006.01)

(56) References Cited

U.S. PATENT DOCUMENTS

| | | |
|---|---|---|
| 2005/0170651 A1 | 8/2005 | Shinma et al. |
| 2006/0076108 A1 | 4/2006 | Holland et al. |
| 2008/0178608 A1 | 7/2008 | Tandou et al. |
| 2011/0024047 A1 | 2/2011 | Nguyen et al. |
| 2014/0209245 A1* | 7/2014 | Yamamoto .......... H01L 21/6831 |
| | | 156/345.53 |

* cited by examiner

ELECTROSTATIC CHUCK

CROSS-REFERENCE TO RELATED APPLICATIONS

This application is a continuation application of International Application PCT/JP2017/018058, filed on May 12, 2017. This application is also based upon and claims the benefit of priority from Japanese Patent Application No. 2016-097287, filed on May 13, 2016, Japanese patent Application No. 2017-016905, filed on Feb. 1, 2017, Japanese Patent Application No. 2017-095300, filed on May 12, 2017; the entire contents of which are incorporated herein by reference.

FIELD OF THE INVENTION

Embodiments of the invention described herein relate generally to an electrostatic chuck.

BACKGROUND OF THE INVENTION

In a plasma processing chamber in which etching, CVD (Chemical Vapor Deposition), sputtering, ion implantation, the like are performed, an electrostatic chuck has been used as a means which adsorbs and holds an object to be processed such as a semiconductor wafer and a glass substrate. The electrostatic chuck applies an electrostatic adsorption voltage to a built-in electrode and adsorbs the substrate such as a wafer or the like by an electrostatic power. The electrostatic chuck is provided with a base plate including a flow path of a cooling gas or the like or a heater, and this allows the temperature of the object to be processed to be controlled.

Recently, in the plasma processing apparatus such as an etching apparatus, the plasma output power has been increased in order to improve a through put or to correspond to a change of a material of the object to be processed. Along with the increase in plasma output, the temperature of the object to be processed such as a wafer or the like becomes high. Along with increase plasma output power and plasma temperature risein plasma, high cooling performance to the object to be processed is desired for the electrostatic chuck.

On the other hand, in order to control an accuracy of the processing (for example, a dimension accuracy of the object to be processed which is processed by the etching), it is required to make the temperature distribution of the object to be processed uniform. For example, uniformity of the temperature distribution in the wafer plane is required.

In the case where the electrostatic chuck includes a base plate including the flow path of the cooling gas or the like or the heater, the temperature distribution of the wafer depends on exchange of heat between the heater and the base plate. In the process of the wafer processing, the temperature of the wafer increases due to RF (Radio Frequency) voltage (high frequency voltage) application. The temperature is controlled by cooling by the base plater. For that reason, temperature controllability of the electrostatic chuck (cooling uniformity of the base plate) and the temperature distribution of the electrostatic chuck are reflected in the temperature distribution of the wafer. In order to control the temperature distribution of the object to be processed, the uniformity of the temperature distribution of the electrostatic chuck is one of the important elements.

In the electrostatic chuck like this, in view of the increase of output power and temperature rise of the process described above, it is further required to improve the uniformity of the temperature distribution in the plane of the electrostatic chuck, and to improve the uniformity of the temperature distribution in the plane of the object to be processed.

SUMMARY OF THE INVENTION

The first invention is an electrostatic chuck including a ceramic dielectric substrate having a first major surface placing an object to be processed and a second major surface on an opposite side to the first major surface; and a base plate provided on a side of the second major surface and supporting the ceramic dielectric substrate, the base plate including a first communication passage passing a medium which adjusts a temperature of the object to be processed, the first communicating passage having an upper surface, a side surface and a lower surface, a ratio of variation of a maximum height Sz in the upper surface to a height of the first communication passage being not more than 1%.

According to the electrostatic chuck, since variation of the maximum height Sz of the upper surface of the first communicating passage is small, uniformity of a temperature distribution in the plane of the electrostatic chuck can be improved, and temperature uniformity in the plane of the object to be processed can be improved.

The second invention is the electrostatic chuck of the first invention, wherein the base plate is provided in a first portion on a side of the second major surface and below the first portion, and has a second portion joined to the first portion, a junction of the first portion and the second portion is located below the center in a vertical direction of the first communicating passage.

According to the electrostatic chuck, since the junction is located below the first communicating passage, the variation of the maximum height Sz of the upper surface of the first communicating passage can be small. Thereby, the temperature uniformity in the plane of the object to be processed can be ensured.

The third invention is the electrostatic chuck of the first or second invention, wherein the variation of the maximum height Sz in the upper surface, variation of the maximum height Sz in the side surface, and variation of the maximum height Sz in the lower surface are different one another.

According to the electrostatic chuck, the variation of the maximum height Sz in each surface of the first communicating passage, namely, the variation of a surface roughness are different one another. On the plane having a large surface roughness, a turbulent flow is easily to occur, and a temperature adjustment effect due to the medium flowing through the first communicating passage becomes high. Thereby, a ramp rate can be high.

The fourth invention is the electrostatic chuck of the third invention, wherein the variation of the maximum height Sz in the upper surface is smaller than the variation of the maximum height Sz in the side surface.

According to the electrostatic chuck, since the variation of a surface roughness of the side surface is large, the turbulent flow is promoted, and the temperature adjustment effect due to the medium flowing through the first communicating passage becomes high. Thereby, the ramp rate can be high.

The fifth invention is the electrostatic chuck of the third or fourth invention, wherein the variation of the maximum height in the upper surface is smaller than the variation of the maximum height Sz in the lower surface.

According to the electrostatic chuck, since the variation of the surface roughness of the lower surface is large, the turbulent flow is promoted, and the temperature adjustment effect due to the medium flowing through the first communicating passage becomes high. Thereby, the ramp rate can be high.

The sixth invention is an electrostatic chuck including a ceramic dielectric substrate having a first major surface placing an object to be processed and a second major surface on an opposite side to the first major surface; and a base plate made of a metal provided on a side of the second major surface and supporting the ceramic dielectric substrate, the base plate including a first communication passage passing a medium which adjusts a temperature of the object to be processed, the first communicating passage having an upper surface, a side surface and a lower surface, variation of a maximum height Sz in the upper surface being smaller than variation of a maximum height Sz in the side surface.

According to the electrostatic chuck, since variation of a surface roughness in the upper surface, uniformity of a temperature distribution in the plane of the electrostatic chuck can be improved, and temperature uniformity in the plane of the object to be processed can be improved. Since variation of a surface roughness in the side surface is large, the temperature adjustment effect due to the medium flowing through the first communicating passage can be high and the ramp rate can be high.

The seventh invention is an electrostatic chuck including a ceramic dielectric substrate having a first major surface placing an object to be processed and a second major surface on an opposite side to the first major surface; and a base plate made of a metal provided on a side of the second major surface and supporting the ceramic dielectric substrate, the base plate including a first communication passage passing a medium which adjusts a temperature of the object to be processed, the first communicating passage having an upper surface, a side surface and a lower surface, variation of a maximum height Sz in the upper surface being smaller than variation of a maximum height Sz in the lower surface.

According to the electrostatic chuck, since variation of a surface roughness in the upper surface, uniformity of a temperature distribution in the plane of the electrostatic chuck can be improved, and temperature uniformity in the plane of the object to be processed can be improved. Since variation of a surface roughness in the lower surface is large, the temperature adjustment effect due to the medium flowing through the first communicating passage can be high and the ramp rate can be high.

The eighth invention is the electrostatic chuck of the sixth or seventh invention, wherein a ratio of the variation of the maximum height Sz in the upper surface to the height of the first communicating passage is not more than 1%.

According to the electrostatic chuck, since the variation of the maximum height Sz of the upper surface of the first communicating passage is small, uniformity of the temperature distribution in the plane of the electrostatic chuck can be improved, and the temperature uniformity of the object to be processed can be improved.

The ninth invention is the electrostatic chuck of one of the first to eighth inventions, wherein a material of the upper surface and a material of the lower surface are different each other.

According to the electrostatic chuck, since the material of the upper surface and the material of the lower surface are made to be different each other, the surface roughness of the upper surface and the surface roughness of the lower surface can be different each other. For example, the lower surface can be rough by using a brazing filler metal for the lower surface. On the rough surface, the turbulent flow is promoted and the ramp rate can be high.

The tenth invention is the electrostatic chuck of the ninth invention, wherein a concentration of aluminum in the material of the upper surface is higher than a concentration of aluminum in the material of the lower surface.

According to the electrostatic chuck, the lower surface can be rougher than the upper surface by the concentration of aluminum. For example, aluminum is used for the material of the upper surface, and a brazing filler metal such as an aluminum alloy including elements other than aluminum is used for the material of the lower surface. On the rough surface, the turbulent flow is promoted, and the ramp rate can be high.

The eleventh invention is the electrostatic chuck of one of the first to tenth inventions, wherein the side surface has a first region on a side of the second major surface and a second region located below the first region, and variation of a maximum height Sz in the first region is smaller than variation of a maximum height Sz in the second region.

According to the electrostatic chuck, since the variation of the surface roughness of the second region is small, the turbulent flow is promoted, and the temperature adjustment effect due to the medium flowing through the first communicating passage becomes high. Thereby, the ramp rate can be high. Since the variation of the surface roughness in the first region located above is small, variation of heat transfer at an upper portion of the first communicating passage can be suppressed. Thereby, the temperature uniformity in the plane of the object to be processed can be improved.

The twelfth invention is the electrostatic chuck of one of the first to tenth invention, wherein the side surface has a first region on a side of the second major surface and a second region located below the first region, and variation of a maximum height Sz in the first region is smaller than variation of a maximum height Sz in the lower surface.

According to the electrostatic chuck, since the variation of the lower surface is large, the temperature adjustment effect due to the medium flowing through the first communicating passage becomes high, and the ramp rate can be high. Since the variation of the surface roughness in the first region is small, variation of heat transfer at an upper portion of the first communicating passage can be suppressed. Thereby, the temperature uniformity in the plane of the object to be processed can be improved.

The thirteenth invention is the electrostatic chuck of one of the first to tenth invention, wherein the side surface has a first region on a side of the second major surface and a second region located below the first region, and an aluminum concentration in a material of the first region is higher than an aluminum concentration in a material of the second region.

According to the electrostatic chuck, the second region can be rougher than the first region by the aluminum concentration. For example, aluminum is used for the material of the first region and a brazing filler metal of an aluminum alloy or the like including an element other than aluminum is used for the material of the second region. The turbulent flow is promoted on the rough surface, and the ramp rate can be high.

The fourteenth invention is the electrostatic chuck of one of the first to thirteenth invention, wherein one of the lower surface and a lower region of the side surface is a turbulent flow promotion portion which stirs the medium.

According to the electrostatic chuck, since the medium is stirred, the temperature adjustment effect due to the medium flowing through the first communicating passage becomes high. Thereby, the ramp rate can be high.

The fifteenth invention is the electrostatic chuck of one of the first to fourteenth invention, wherein the material of the upper surface is the same as the material inside the base plate.

According to the electrostatic chuck, since the material of the upper surface is the same the material inside the base plate, variation of the surface roughness of the upper surface can be suppressed.

The sixteenth invention is the electrostatic chuck of one of the first to fifteenth invention, wherein the height of the first communicating passage is longer than a width of the first communicating passage.

According to the electrostatic chuck, the first communicating passage can be disposed in the base plate more densely. A pressure loss of the medium adjusting the temperature can be suppressed. Thereby, the temperature uniformity in the plane of the object to be processed can be improved.

The seventeenth invention is the electrostatic chuck of the sixteenth invention, wherein a ration of the height of the first communicating passage to the width of the first communicating passage is not less than 1 and less than 6.

According to the electrostatic chuck, the first communicating passage can be disposed in the base plate more densely. A pressure loss of the medium adjusting the temperature can be suppressed. Therefore, the temperature uniformity in the plane of the object to be processed can be improved.

The eighteenth invention is the electrostatic chuck of one of the first to seventeenth invention, wherein a ratio of a distance between an upper surface of the second major surface of the base plate and the upper surface of the first communicating passage to the height of the first communicating passage is not less than 0.1 and not more than 10.

According to the electrostatic chuck, the high ramp rate and improvement of the temperature uniformity in the plane of the object to be processed can be made compatible.

The nineteenth invention is the electrostatic cuck pf one of the first to eighteenth invention, wherein the first communicating passage further includes a curved connection portion connecting the upper surface and the side surface.

According to the electrostatic chuck, influence of the turbulent flow at the connection portion between the upper surface and the side surface can be suppressed. Thereby, the temperature uniformity in the plane of the object to be processed can be improved.

The twentieth invention is the electrostatic chuck of one of the first to nineteenth invention, wherein the first communicating passage has a first space one side of the second major surface and a second space below the first space, and a width of the second space becomes narrow toward below.

According to the electrostatic chuck, a joining surface of the base plate can be broad, and joining strength can be improved. In the case where the brazing filler metal is used for the joining surface, the brazing filler metal can be suppressed from rising to the upper portion of the first communicating passage along the side surface of the first communicating passage.

The twenty-first invention is the electrostatic chuck of one of the first to twentieth invention, wherein the base plate includes a first portion, a third portion provided above the first portion and joined to the first portion, and a second communicating passage provided between the first portion and the third portion, the second communicating passage passing a gas medium different from a medium flowing through the first communicating passage, the second communicating passage is provided on a side of the second major surface from the first communicating passage.

According to the electrostatic chuck, the gas medium which transfers heat between the objects to be processed can be supplied to a predetermined position with a predetermined pressure by passing the gas medium through the second communicating passage.

The twenty-second invention is the electrostatic chuck of the twenty-first invention, wherein a junction of the first portion and the third portion is located below the center in a vertical direction of the second communicating passage, the second communicating passage has a third space on a side of the second major surface and a fourth space below the third space, and a width of the fourth space becomes narrow toward below.

According to the electrostatic chuck, the joining surface of the base plate can be broad, and joining strength can be improved. In the case where the brazing filler metal is used for the joining surface, the brazing filler metal can be suppressed from rising to the upper portion of the second communicating passage along the side surface of the second communicating passage.

The twenty-third invention is the electrostatic chuck of the second invention, wherein the base plate further includes a third portion provided above the first portion and joined to the first portion, and a second communicating passage provided between the first portion and the third portion, a gas medium flowing through the second communicating passage, and a junction of the first portion and the third portion is located below the center in a vertical direction of the second communicating passage.

According to the electrostatic chuck, since the junction is located below the second communicating passage, variation of a maximum height Sz of an upper surface of the second communicating passage can be small. Thereby, the temperature uniformity of the object to be processed can be ensured.

DETAILED DESCRIPTION

Figure 1:
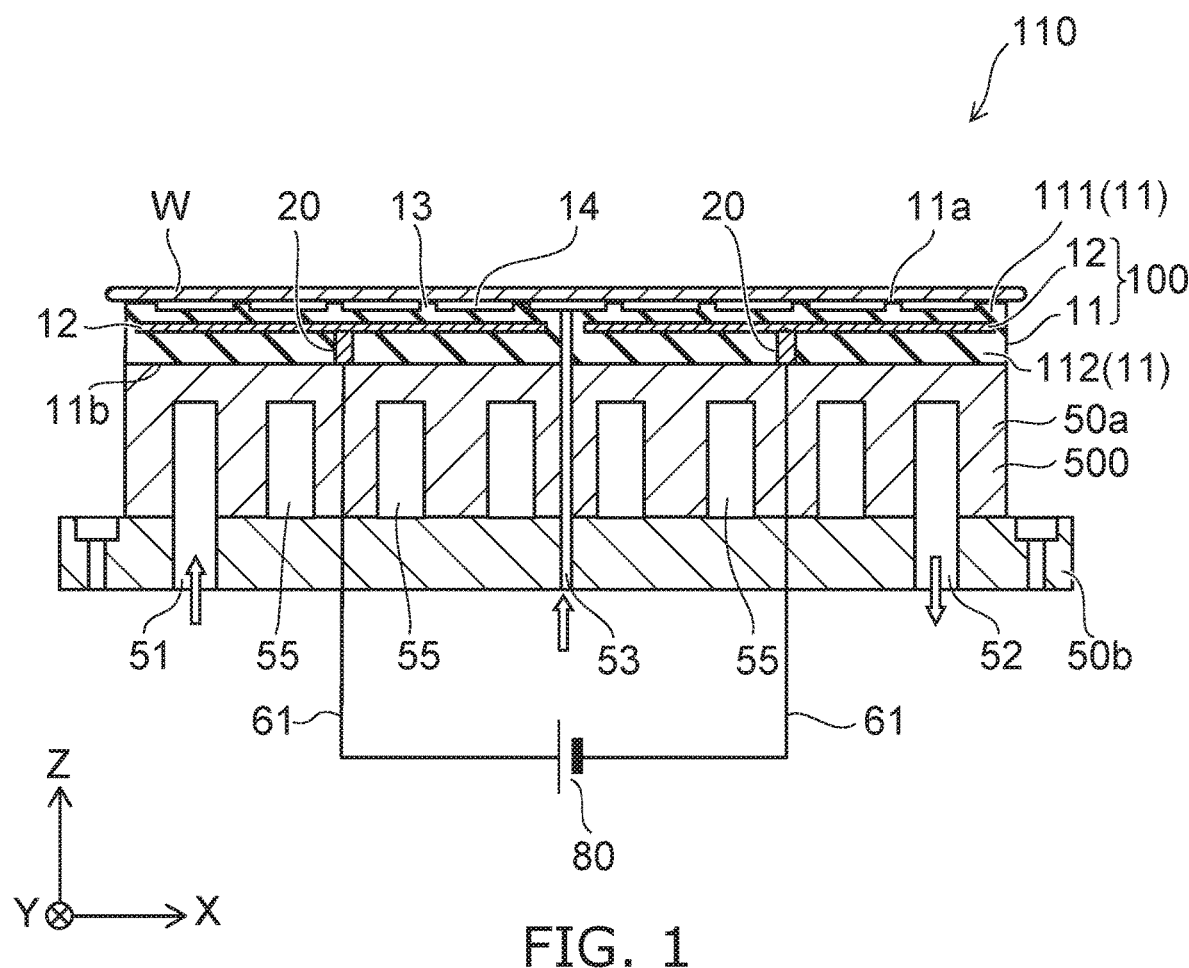
FIG. 1 is a cross-sectional view illustrating an electrostatic chuck according to an embodiment.

Various embodiments will be described hereinafter with reference to the accompanying drawings. In the drawings, similar components are marked with like reference numerals, and a detailed description is omitted as appropriate.

FIG. 1 is a cross-sectional view illustrating an electrostatic chuck according to an embodiment.

As shown in FIG. 1, an electrostatic chuck 110 according to the embodiment includes a ceramic dielectric substrate 11 and a base plate 500.

The ceramic dielectric substrate 11 is, for example, a flat base material made of a polycrystalline ceramic sintered body, and has a first major surface 11a placing an object to be processed W such as a semiconductor wafer or the like and a second major surface 11b on an opposite side to the first major surface 11a.

The electrostatic chuck 110 includes an electrode layer 12. The electrode layer 12 is intervened between the first major surface 11a and the second major surface 11b. That is, the electrode layer 12 is formed so as to be inserted into the ceramic dielectric substrate 11. The electrode layer 12 is sintered integrally with the ceramic dielectric substrate 11. An electrostatic chuck substrate 100 is a plate-shaped structure body including the ceramic dielectric substrate 11 and the electrode layer 12 provided on the ceramic dielectric substrate 11.

The electrostatic chuck 110 is, for example, a Coulomb-type electrostatic chuck. A volume resistivity of the ceramic dielectric substrate 11 is, for example, not less than $1\times10^{14}$ Ω·cm. The electrostatic chuck 110 generates a charge on the first major surface 11a side of the electrode layer 12 by applying an electrostatic adsorption voltage 80 to the electrode layer 12, and adsorbs and holds the object to be processed W by the electrostatic force.

Here, in the description of the embodiment, a direction connecting the first major surface 11a and the second major surface 11b is taken as a Z-direction (vertical direction), one of directions orthogonal to the Z-direction is taken as an X-direction, and a direction orthogonal to the Z-direction and the X-direction is taken as a Y-direction, A direction from the second major surface 11b toward the first major surface 11a is taken as an upward direction, and a direction toward the opposite to the upward direction is taken as a downward direction.

The electrode layer 12 is provided along the first major surface 11a and the second major surface 11b of the ceramic dielectric substrate 11. The electrode layer 12 is an adsorption electrode for adsorbing and holding the object to be processed W. The electrode layer 12 may be either a unipolar type or a bipolar type, and may be either a triode type or other multipole type. The number and disposition of the electrode layer 12 is appropriately selected. The electrode layer 12 shown in FIG. 1 is the bipolar type, and the electrode layers 12 of two poles are provided on the same plane.

The ceramic dielectric substrate 11 includes a first dielectric layer 111 between the electrode layer 12 and the first major surface 11a and a second dielectric layer 112 between the electrode layer 12 and the second major surface 11b. A transmittance of a visible light in at least the first dielectric layer 111 of the ceramic dielectric substrate 11 is, for example, larger than 0% and not more than 3.7%. Here, the transmittance of the visible light is a transmittance in the case of irradiating a light with a wavelength of about 600 nanometers (nm) to a dielectric with a thickness of 1 millimeter (mm).

A material of a crystal included in the ceramic dielectric substrate 11 is, for example, one of $Al_2O_3$, $Y_2O_3$ and YAG. A visible light transparency, an insulation resistance and a plasma resistance in the ceramic dielectric substrate 11 can be increased by using this material.

A thickness of the first dielectric layer 111 of the ceramic dielectric substrate 11 is, for example, not less than 100 micrometers (μm). If the thickness of the first dielectric layer 111 is not less than 100 μm, a sufficient insulation resistance in the electrostatic chuck 110 can be maintained. Influence of the thickness of the first dielectric layer 111 to the adsorption power is large, and the thickness can be appropriately set in order to make the temperature of the objet to be processed desired W. In the embodiment, the thickness of the first dielectric layer 111 can be set, for example, to from 100 μm to 1000 μm, more favorably from 100 μm to 500 μm.

A thickness of the second dielectric layer 112 of the ceramic dielectric substrate 11 can be set appropriately similarly. A total thickness of the electrostatic chuck substrate 100 provided with the electrode layer 12 on the ceramic dielectric substrate 11 is favorably to be, for example, from 0.5 mm to 7 mm by considering a mechanical strength and a cooling performance of the ceramic dielectric substrate 11.

The base plate 500 is provided on a side of the second major surface 11b of the ceramic dielectric substrate 11, and supports the ceramic dielectric substrate 11. That is, the ceramic dielectric substrate 11 (the electrostatic chuck substrate 100) is attached onto the base plate 500. For attaching the ceramic dielectric substrate 11 to the base plate 500, a heat resistance resin such as silicone or the like, indium joining and brazing or the like are used. An adhesive material is appropriately selected from a viewpoint of an operating temperature zone and cost or the like.

The base plate 500 includes a first portion 50a and a second portion 50b. The first portion 50a is provided on an upper side (the second major surface 11b side), and the second portion 50b is provided below the first portion 50a.

The base plate 500 is, for example, made of a metal. A material of the base plate 500 (the first portion 50a and the second portion 50b) can be based on, for example, at least one of aluminum, titanium, nickel, iron or chromium. The material of the base plate 500 may be stainless steel. The surface of the base plate 500 may be plated with, for example, nickel or the like. The range of "made of a metal" also includes the case of a portion of the base plate 500 being formed of other than metal in addition to the case of the base plate 500 being formed of only metal. The first portion 50a and the second portion 50b are joined by electron beam welding or brazing or the like.

The base plate 500 includes a communicating passage 55 (the first communicating passage). The communicating passage 55 is a space formed between the first portion 50a and the second portion 50b. The communicating passage 55 is connected to an input path 51 at one end side, and is connected to an output path 52 at other end side.

A medium adjusting the temperature of the object to be processed W is passed through the communicating passage 55. Thereby, the base plate 500 performs the temperature adjustment of the electrostatic chuck substrate 100 and the object to be processed W placed thereon. For example, in the case where the electrostatic chuck substrate 100 is cooled, a cooling medium flows from the input path 51, passes through the communicating passage 55 and flows out from the output path 52. Thereby, the heat of the base plate 500 can be absorbed by the cooling medium, and the electrostatic chuck substrate 100 attached thereon can be cooled. As the medium adjusting the temperature of the object to be processed W, for example, water, ethylene glycol, fluorinert (made by 3M Corp.) or galden (made by SOVAY Corp.) or the like are used.

On the other hand, in the case of keeping warm the electrostatic chuck substrate 100, it is also possible to put a thermal insulating medium into the communicating passage 55. Or, it is also possible to incorporate a heating element into the electrostatic chuck substrate 100 and the base plate 500. In this way, if the temperature of the electrostatic chuck substrate 100 is adjusted via the base plate 500, the temperature of the object to be processed W adsorbed and held by the electrostatic chuck substrate 100 can be easily adjusted.

Projections 13 are provided as necessary on a side of the first major surface 11a of the ceramic dielectric substrate 11, and grooves 14 are provided between the projections 13. The grooves 14 are communicating, and a space is formed between a back surface of the object to be processed W installed on the electrostatic chuck 110 and the groove 14.

An introduction path 53 piercing the base plate 500 and the ceramic dielectric substrate 11 is connected to the groove 14. If a transfer gas such as helium (He) or the like is introduced from the introduction path 53 in a state of adsorbing and holding the object to be processed W, the transfer gas is flown in the space provided between the object to be processed W and the groove 14, and the object to be processed W can be directly cooled by the transfer gas.

Here, by appropriately selecting a height of the projection 13 (a depth of the groove 14), an area ratio and shapes or the like of the projection 13 and the groove 14, the temperature of the object to be processed W and particles adhering to the object to be processed W can be controlled in a favorable condition.

A connection portion 20 is provided on the second major surface 11b of the ceramic dielectric substrate 11. A contact electrode is provided on the upper portion of the base plate 500 corresponding to a position of the connection portion 20. Therefore, if the electrostatic chuck 110 is attached to the upper portion 50a of the base plate 500, the contact electrode 61 contacts the connection portion 20, and thereby the contact electrode 61 and the electrode layer 12 becomes electrically conductive via the connection portion 20.

The contact electrode 61 is based on, for example, a movable probe. Thereby, the contact electrode 61 surely contacts the connection portion 20, and damage to the connection portion 20 due to contacting the contact electrode 61 is suppressed to minimum. The contact electrode 61 is not limited to the above, and any form such as the configuration of simply contacting the connection portion 20 and the connection to the connection portion 20 by mating or screwing may be accepted.

Figure 2A:
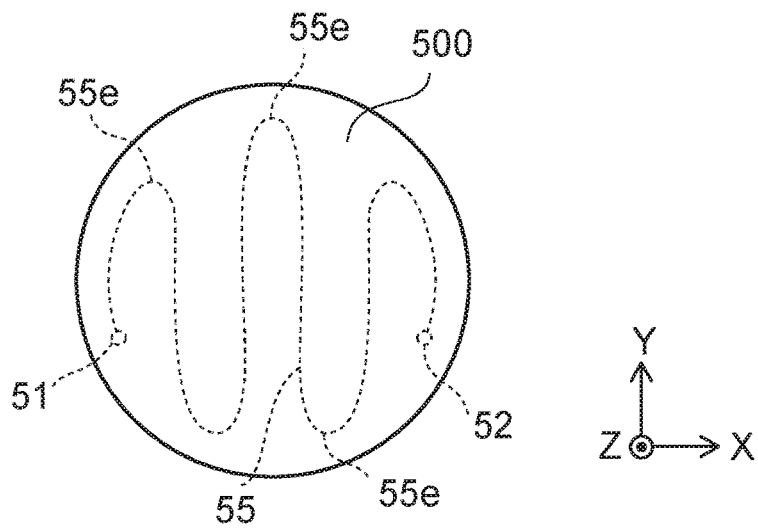
FIG. 2A to FIG. 2C are plan views illustrating a base plate of the electrostatic chuck according to the embodiment.
Figure 2B:
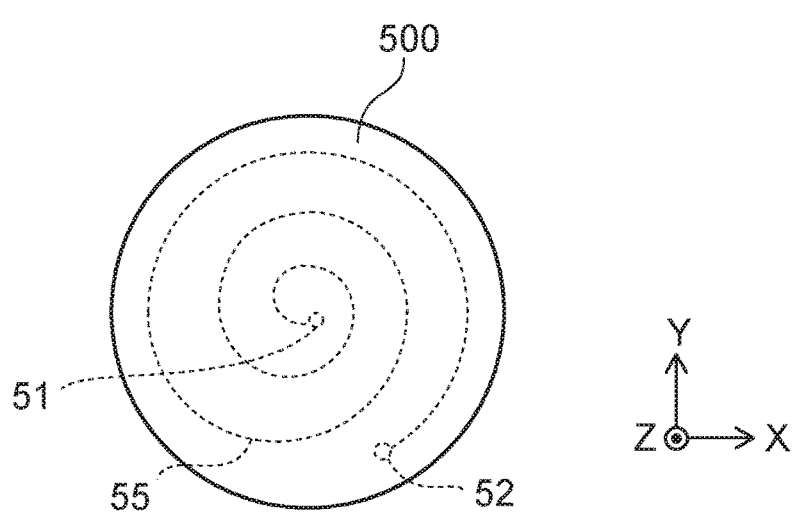
Figure 2C:
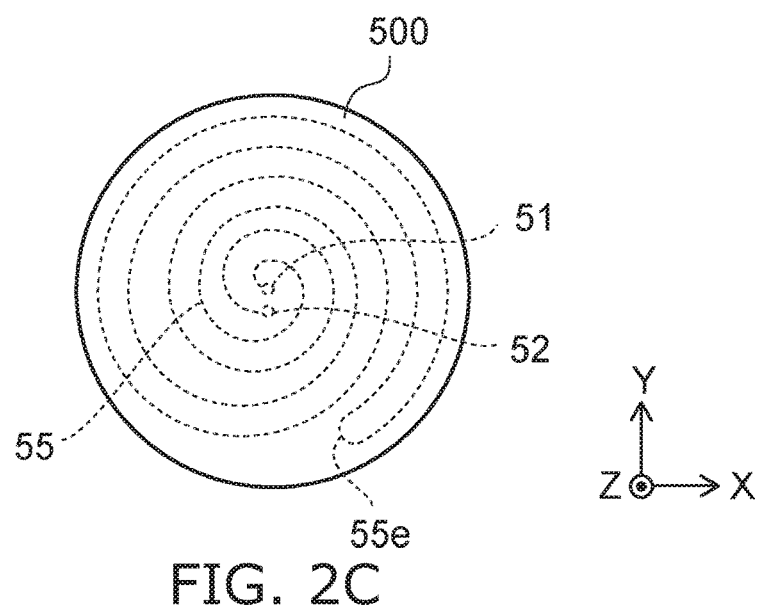

FIG. 2A to FIG. 2C are plan views illustrating a base plate of the electrostatic chuck according to the embodiment.

For example, as shown in FIG. 2, when viewing the base plate 500 from above, the input path 51 and the output path 52 are provided near the outer circumference of the base plate 500, and are separated each other in the X-direction. The communicating passage 55 connecting the input path 51 and the output path 52 includes multiple folded portions 55e. The folded portions 55e are bent portions of the communicating passage 55 in an X-Y plane, and an extension direction of the communicating passage in the folded portions 55e changes from a certain direction to the reverse direction. The communicating passage 55 is disposed to extend over the almost whole of the base plate 500 by the multiple folded portions 55e when viewed from above.

A planar pattern of the communicating passage 55 may be a pattern shown in FIG. 2B or FIG. 2C. In the example of FIG. 2B, the input path 51 is provided in the center portion of the base plate 500, and the output path 52 is provided near the outer circumference of the base plate 500. The planar pattern of the communicating passage 55 is spiral centered on the input path 51. In the example of FIG. 2C, the input path 51 and the output path 52 are provided on the center portion of the base plate 500. The planar pattern of the communicating passage 55 is spiral centered on the input path 51 and the output path 52. The folded portions 55e are provided near the outer circumference. The position of the input path 51 and the position of the output path 52 may be replaced.

In the embodiment, the planar pattern of the communicating passage 55 is not limited to the example shown. The planar pattern of the communicating passage 55 is appropriately adjusted so as to uniformly adjust the whole temperature of the electrostatic chuck substrate 100 and the object to be processed W.

Figure 3:
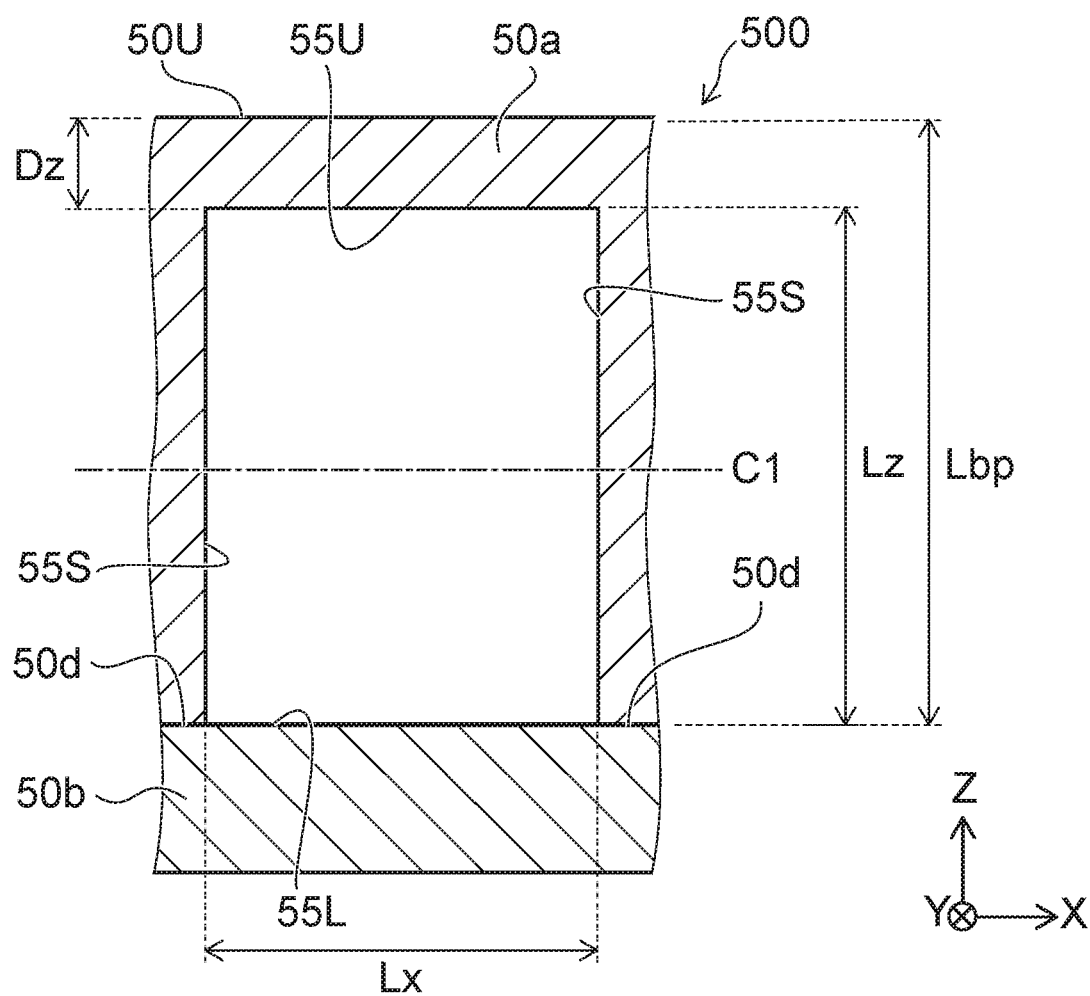
FIG. 3 is a cross-sectional view illustrating a portion of the base plate of the electrostatic chuck according to the embodiment.

FIG. 3 is a cross-sectional view illustrating a portion of the base plate of the electrostatic chuck according to the embodiment.

FIG. 3 shows, for example, a cross-section in a plane orthogonal to the extension direction of the partial communicating passage 55. That is, a cooling medium or the like flows in a vertical direction to a paper surface in the communicating passage shown in FIG. 3.

As shown in FIG. 3, the communicating passage 55 has an upper surface 55U, a side surface 55S, and a lower surface 55L. The upper surface 55U and the lower surface 55L are planes extending along the X-Y plane, respectively, and are separated each other in the Z-direction. The side surface 55A is a plane crossing the X-Y plane, and connects the upper surface 55U and the lower surface 55L.

Along with increase of plasma output power and plasma temperature risein plasma process, it is required for the electrostatic chuck to make high cooling performance (high ramp rate) and uniformity of the temperature distribution compatible. The inventors of the application have found that the uniformity of the temperature distribution of the object to be processed is improved by controlling not only the planar pattern of the communicating passage but also shapes in the communicating passage (unevenness and cross-sectional shape of the inner surface). Thereby, the high ramp rate and the uniformity of the temperature distribution can be compatible at a high level. The shapes in the communicating passage allow the flow of the medium adjusting the temperature to be controlled and the uniformity of the temperature distribution of the high ramp rate to be satisfied.

Specifically, the inventors of the application have found that the uniformity of the temperature distribution in the plane (the X-Y plane) of the electrostatic chuck 110 and the object to be processed W can be improved by making a ratio of variation of a maximum height Sz in the upper surface 55U to a height of the communicating passage 55 not more than 1%.

Here, the height of the communicating passage 55 is a length (Lz) along the Z-direction of the communicating passage 55. Lz is, for example, not less than 8 mm and not more than 18 mm.

In the embodiment, the highest height Sz (μm) in the respective planes is measured by observing the respective planes (surfaces). A digital microscope can be used for observation, and the magnification is, for example, approximately 100 times.

Figure 4A:
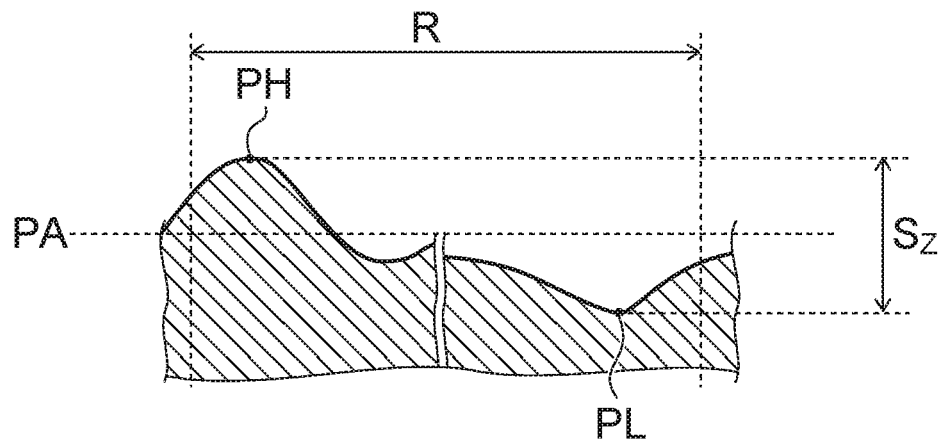
FIG. 4A and FIG. 4B are schematic views illustrating a measurement method of a maximum height Sz.
Figure 4B:
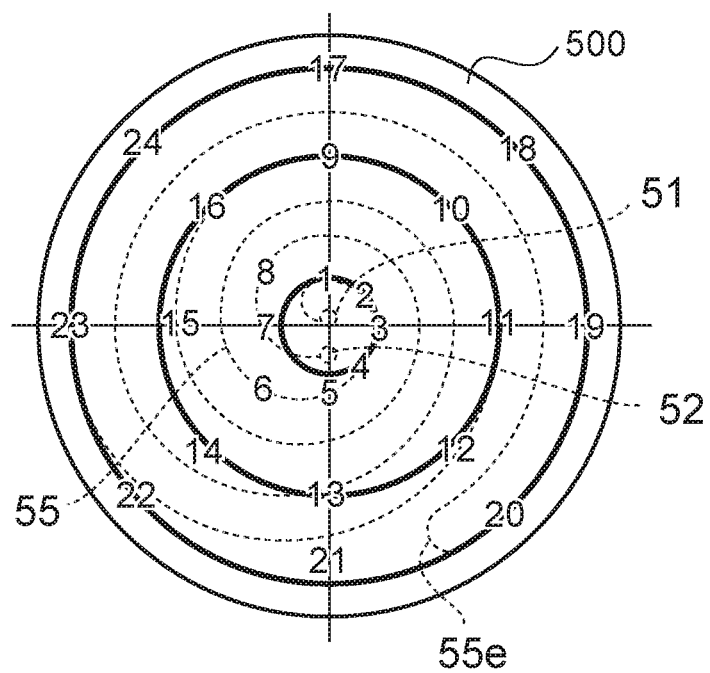

FIG. 4A and FIG. 4B are schematic views illustrating a measurement method of the maximum height Sz.

FIG. 4A is a schematic cross-sectional view illustrating the unevenness in an observation range R of the surface to be observed. In an image map measured by an arbitrary magnification, a difference between a height of the highest point (point PH) of the unevenness of the surface and a height of the lowest point (point PL) of the unevenness of the surface is taken as the highest height Sz. In other word, the highest height Sz is a length between the point PH which protrudes most from an average surface PA of the observation range and the point PL which is most dented along the vertical direction to the relevant average surface in the observation range. In the case where the object to be observed is the upper surface 55U, the highest height Sz (μm) is a difference between the position in the Z-direction of the highest point of the upper surface 55U and the position in the Z-direction of the lowest point of the upper surface 55U in the observation range. Therefore, as the surface is rougher, the maximum height Sz (μm) becomes large.

The variation of the maximum height Sz (surface roughness) in the flow path (the communicating passage 55 or the like) will be described.

The maximum height Sz is measured at 24 points in the plane, for example. FIG. 4B illustrates measurement points in the case where the plane pattern of the communicating passage 55 is shown in the example of FIG. 2C. Places marked with figurers of 1 to 24 correspond to the measurement points.

Three measurement points are selected on the communicating passage 55 positioned on one direction from the center of the base plate 500 toward the outer circumference. The three measurement points are selected as a guide based on the position dividing the radius of the base plate into three equal parts. For example, in the case of the radius of the base plate being 150 mm, a point of 50 mm from the center, a point of 100 mm from the center, and a point of 150 mm from the center are taken as the measurement points. In the case where the communicating passage 55 is not located at positions apart from the center by the above distances from the center, the measurement points are selected on a portion of the communicating passage 55 closest to the relevant positions. For each of the eight directions from the center of the base plate 500 toward the outer circumference, three measurement points are selected as described above, and the measurement points are 24 in total. The eight directions are determined to divide the circumference (the outer circumference of the base plate) into generally eight equal parts. That is, an angle formed by adjacent two directions of the eight directions is appropriately 45°. The size of one measurement point (observation range) can be, for example, appropriately 10 (mm)×10 (mm).

The maximum height Sz is measured for each of the above 24 points of the measurement points. A difference between the maximum value Sz-max and the minimum value Sz-min of the measured maximum heights of 24 points is taken as variation of the surface roughness (maximum height).

Figure 5:
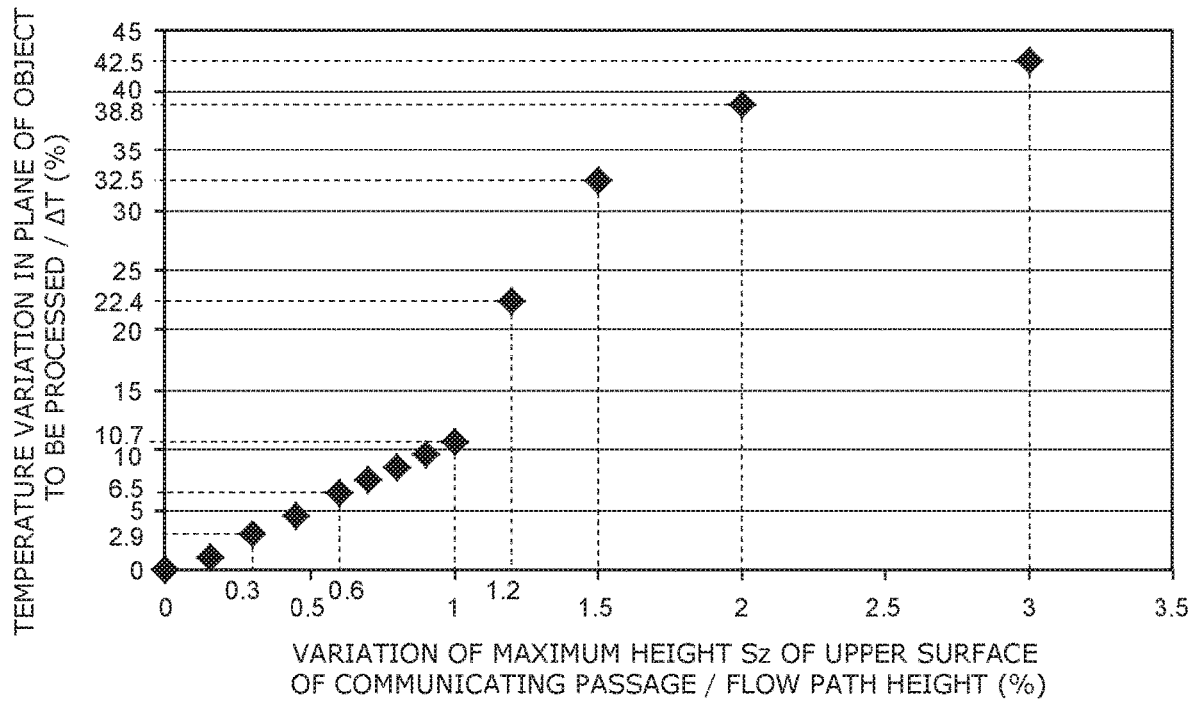
FIG. 5 is a graph view illustrating the relationship between the structure of the electrostatic chuck and the uniformity of the temperature distribution in the plane of the object to be processed.

FIG. 5 is a graph view illustrating the relationship between the structure of the electrostatic chuck and the uniformity of the temperature distribution in the plane of the object to be processed.

The object to be processed W in FIG. 5 is, for example, a semiconductor wafer. The horizontal axis of FIG. 5 represents a ratio of the variation of the maximum height Sz in the upper surface 55U to the height of the communicating passage 55. That is, the horizontal axis of FIG. 5 represents ((Sz–max)–(Sz–min))/Lz (%).

When calculating a value on the horizontal axis of FIG. 5, a digital microscope (made of Keyence Corp., VHX-2000) is used and the magnification is set to 100 times. The above 24 points are selected on the surface of the upper surface 55U in the flow path (the communicating passage 55) as the measurement points.

The value on the horizontal axis of FIG. 5 is a value of the difference between the maximum value (Sz–max) of Sz and the minimum value (Sz–min) on the above 24 points divided by the height of the communicating passage 55. As the base plate has larger variation in the surface roughness at 24 points in the flow path, the value on the horizontal axis is larger. When calculating the ratio, units of Lz, Sz–max, Sz–min are matched to mm, for example.

The vertical axis of FIG. 5 represents the temperature variation in the plane of the object to be processed/ΔT (%).

"ΔT (° C.)" is a change width of the temperature of the object to be processed W. ΔT corresponds, for example, to a difference between the temperature of a chiller controlling the temperature of the medium passing through the communicating passage 55 and the temperature of the object to be processed W. ΔT is a width of the temperature of the object to be processed W changed by a heater and a RF voltage or the like, for example. That is, for example, in the case where the set temperature of the temperature adjustment medium or the like of the chiller is T1 (° C.), and the temperature of the object to be processed W (for example, average temperature) is T2 (° C.), in other word, in the case where the temperature of the object to be processed W (average temperature) is changed from T2 to T1 by the electrostatic chuck, ΔT=|T2-T1|.

"Temperature variation in the plane of the object to be processed (° C.)" is a temperature difference between the place at the maximum temperature and the place at the minimum temperature in the plane (X-Y plane) of the object to be processed W when the temperature of the object to be processed W is change by only ΔT.

As shown in FIG. 5, when the value on the horizontal axis is large, the value on the vertical axis is large. That is, when the variation of the surface roughness on the upper surface 55U (24 points selected on the upper surface 55U in the flow path) is large, the in-plane temperature uniformity of the object to be processed W is lowered. It is seen that the slope of the graph changes around 1% of the value on the horizontal axis. The slope of the graph is steep when the value on the horizontal axis exceeds 1%, and the in-plane temperature uniformity of the object to be processed W is found to be lowered easily.

In the case where the variation of the surface roughness (maximum height Sz) on the upper surface 55U of the communicating passage 55 (24 points selected on the upper surface 55U in the flow path) is large, it is considered that variation is generated also in the heat transfer between the cooling medium or the like in the communicating passage 55 and the upper surface 55U. As a result, the variation is generated also in the temperature of the object to be processed W placed above the communicating passage 55.

Then, in the embodiment, a ratio of the variation of the maximum height Sz on the upper surface 55U to the height of the communicating passage 55 is set to be not more than 1%, more desirably not more than 0.5%. Thereby, the in-plane temperature uniformity of the object to be processed W can be improved, and the temperature variation in the plane of the object to be processed/ΔT can be appropriately not more than 10%.

As described previously, the communicating passage 55 is formed by joining the first portion 50a and the second portion 50b. Referring again FIG. 3, a junction 50d of the first portion 50a and the second portion 50b is located below the center C1 in the Z-direction of the communicating passage 55. In this example, the upper surface 55U and the side surface 55S are formed of the first portion 50a, and the lower surface 55L is formed of the second portion 50b. That is, the junction 50d is located near the boundary of the side surface 55S and the lower surface 55L. The position in the Z-direction of the junction 50d and the position in the Z-direction of the lower surface 55L are generally the same.

When the first portion 50a and the second portion 50b are joined by the electron beam welding, and brazing, the surface of the communicating passage 55 may be rough. On the contrary, since the junction 50d is located below the communicating passage 55 in the embodiment, the variation of surface roughness in the upper surface 55U of the communicating passage 55 (24 points selected on the upper surface 55U in the flow path) is suppressed from increasing by joining. Thereby, the temperature uniformity of the object to be processed W can be ensured.

The roughness of the respective surfaces in the communicating passage 55 may be different one another. The variation of the surface roughness in the respective surfaces in the communicating passage 55 may be different one another. That is, the variation of the surface roughness in the upper surface 55U (24 points selected on the upper surface 55U in the flow path), the variation of the surface roughness in the side surface 55S (24 points selected on the side surface 55S in the flow path), and the variation of the surface roughness in the lower surface 55L (24 points selected on the lower surface 55L in the flow path) may be different one another.

When the cooling medium or the like flows in the communicating passage 55, the cooling medium or the like is stirred by the evenness of the surface near the surface having large surface roughness or large variation of the surface roughness. Thereby, the surface having the large surface roughness or the large variation of the surface roughness functions as a turbulent flow promotion part. When the turbulent flow is generated, heat exchange between the cooling medium or the like flowing in the communicating passage and the base plate 500 is promoted, and the temperature adjustment effect such as a cooling effect or the like is increased. A surface area increases because of the large surface roughness or the large variation of the surface roughness. Thereby, the ramp rate (Ramp rate) can be high.

In the electrostatic chuck 110 according to the embodiment, the variation of the surface roughness in the upper surface 55U (24 points selected on the upper surface 55U in the flow path) is smaller than the variation of the surface roughness in the side surface 55S (24 points selected on the side surface 55S in the flow path). The variation of unevenness height in the upper surface 55U is smaller than the variation of the surface roughness in the lower surface 55L (24 points selected on the lower surface 55L in the flow path). The in-plane temperature uniformity is improved by making the variation of the surface roughness in the upper surface 55U small as described with respect to FIG. 5. The turbulent flow is promoted by roughening the lower surface 55L and the side surface 55S. Thereby, the temperature adjustment effect by the medium flowing in the communicating passage 55 can be high and the ramp rate can be high.

Figure 6:
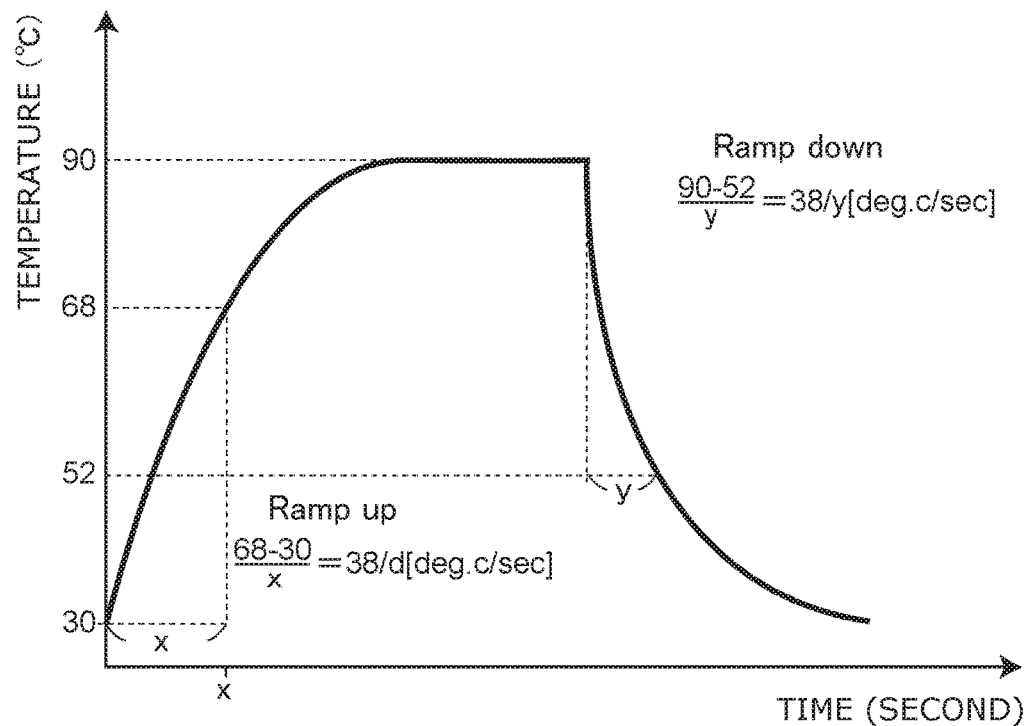
FIG. 6 is a graph view describing a ramp rate.

FIG. 6 is a graph view describing a ramp rate.

The ramp rate (temperature followability up to a predetermined temperature per unit time) is an average of ramp up (temperature rising) and ramp down (temperature falling), and indicates the temperature followability of the temperature of the object to be processed W to a heat source. That is, the ramp rate corresponds to a speed at which the temperature of the object to be processed W reaches the relevant temperature when changing the set temperature. As the ramp rate is higher, the followability is better, and the ramp rate relates to a tact time.

Since the ramp up and ramp down are indexes of response of a transient phenomenon, the idea of time constant is introduced. The time constant indicates a time until the temperature of the system reaches $(1-e^{-1})$ times of a target value (e is the base of natural logarithm). This means the use of the time until the temperature of the object to be processed W reaches about 63.2% of the target value.

For example, the increase (Ramp up) of 60° C., namely the increase of the temperature of the chiller from 30° C. to 90° C., is considered. Since 63.2% of 60° C. is 38° C. under consideration of the time constant being 63.2%, the ramp up here is the temperature rising per one second when the temperature is increased from 30° C. to 68° C. On the other hand, the decrease (ramp down) from 90° C. to 30° C. is considered. The ramp down is the temperature falling per one second when the temperature is decreased from 90° C. to 52° C.

Figure 7:
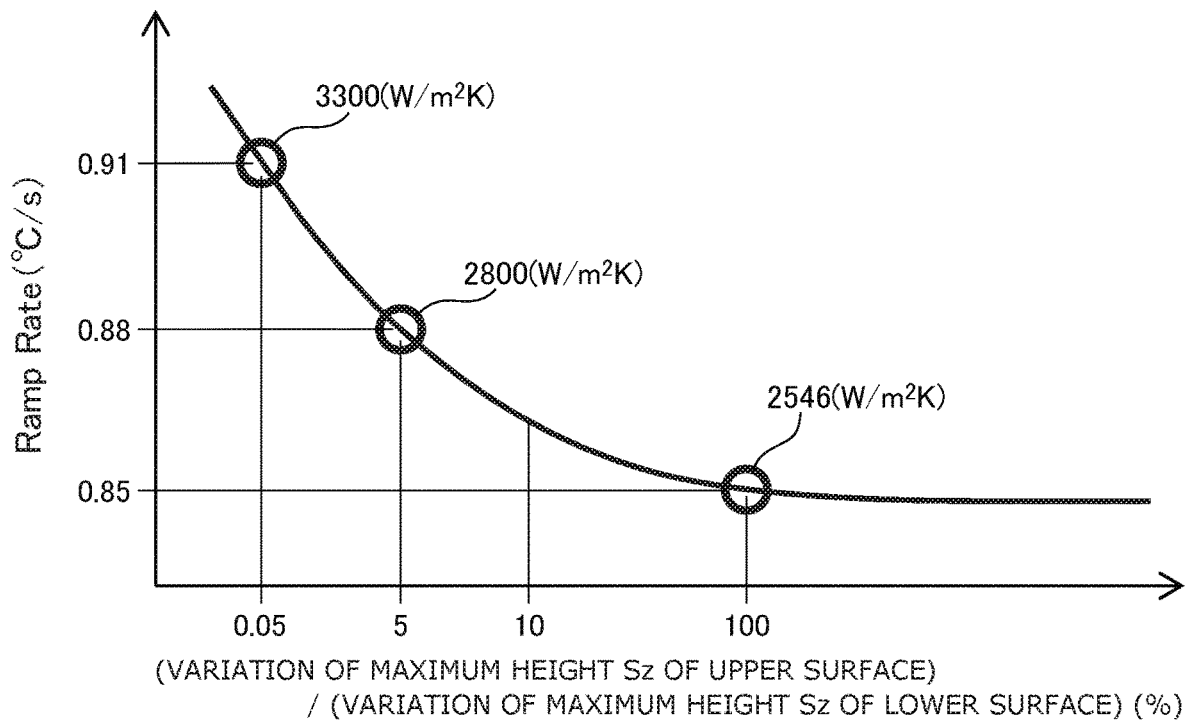
FIG. 7 is a graph view illustrating the relationship between the structure of the electrostatic chuck and the ramp rate.

FIG. 7 is a graph view illustrating the relationship between the structure of the electrostatic chuck and the ramp rate.

The vertical axis of FIG. 7 represents the ramp rate (° C./second (s)).

The horizontal axis of FIG. 7 represents (the variation of the maximum height Sz in the upper surface)/(the variation of the maximum height Sz in the lower surface)(%). That is, the horizontal axis corresponds to a ratio of the variation of the maximum height Sz in the upper surface 55U to the variation of the maximum height Sz in the lower surface 55L. The variation of the maximum height Sz in the upper surface is fixed to 1 μm in the data shown in FIG. 7.

As shown in FIG. 7, when the value of the horizontal axis is 100%, the ramp rate is 0.85 (° C./s), and a heat transfer coefficient h (the average heat transfer coefficient between the medium in the communicating passage and the base plate) is 2546 (W/m²K). When the value of the horizontal axis is 5%, the ramp rate is 0.88° C./s, and the heat transfer coefficient h is 2800 (W/m²K). When the value of the horizontal axis is 0.05%, the ramp rate is 0.91 (° C.), and the heat transfer coefficient h is 3300 (W/m²K).

In this way, in a range where the value of the horizontal axis is less than 100%, as the value of the horizontal axis is smaller, the heat transfer coefficient h increases and the ramp rate becomes high. That is, in the case where the variation of the surface roughness in the upper surface is small in comparison with the variation of the surface roughness in the lower surface, the ramp rate can be high by increasing the variation of the surface roughness in the lower surface. In the range of the value of the horizontal axis being not less than 100%, the change of the heat transfer coefficient h is small even if the value of the horizontal axis becomes larger. In the embodiment, (the variation of the maximum height Sz in the upper surface)/(the variation of the maximum height Sz in the lower surface) is favorably to be less than 100%, and more favorably to be not more than 10%, further favorably not less than 5%.

When an upper plate of the communicating passage 55 is thick, heat capacity of the base plate becomes large, and thus the ramp rate is decreased. The upper plate thickness is a distance (Dz shown in FIG. 3) between the upper surface 55U of the base plate 500 and the upper surface 55U of the communicating passage 55.

Figure 8:
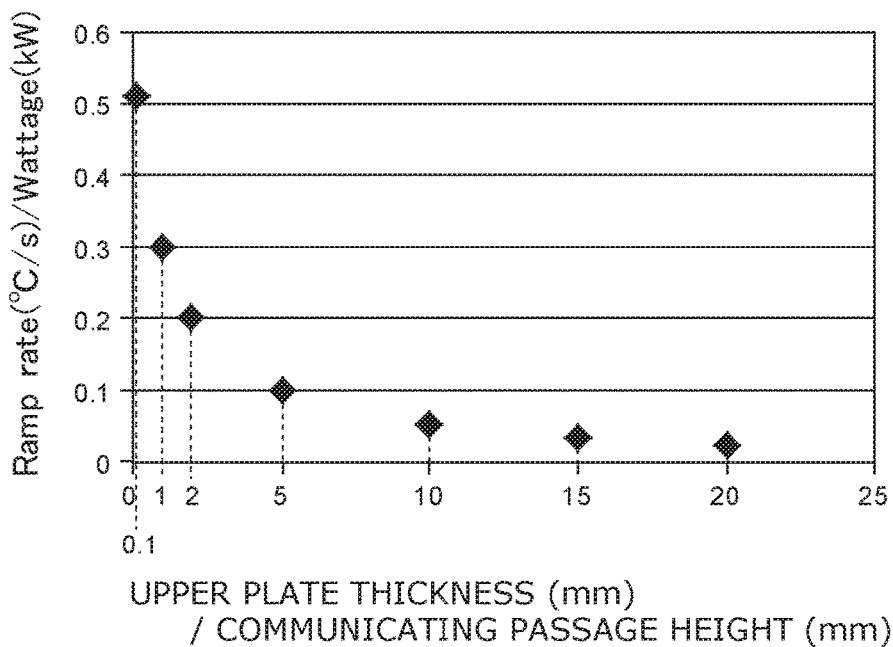
FIG. 8 is a graph view illustrating the relationship between the structure of the electrostatic chuck and the ramp rate.

FIG. 8 is a graph view illustrating the relationship between the structure of the electrostatic chuck and the ramp rate.

The ramp rate is normalized by an amount of input heat from the heat source. The value of the ramp rate (° C./second(s)) divided by the amount of input heat Y kilowatt (kW) is plotted on the vertical axis. The horizontal axis of FIG. 8 represents a ratio of the upper plate thickness to the height of the communicating passage 55. That is, the value of the horizontal axis is Dz (mm)/Lz (mm).

The specification required for the electrostatic chuck of high ramp rate (High Ramp rate ESC) is, for example, that the value of the vertical axis of FIG. 8 is not less than 0.05. Consequently, it is desired that the ratio of the upper plate thickness to the height of the communicating passage 55 is not more than 10. It is difficult to set the ratio of the upper plate thickness to the height of the communicating passage 55 not more than 0.1 from the viewpoint of the temperature uniformity. In the embodiment, the ratio of the upper plate thickness to the height of the communicating passage 55 is set to be not less than 0.1 and not more than 10. Thereby, the high ramp rate and the in-plane temperature uniformity of the object to be processed W can be compatible.

As shown in FIG. 3, the height (length (Lz)) of the communicating passage 55 is longer than a width of the communicating passage 55 (a length Z(Lx) along a direction of the cooling medium flow and a perpendicular direction to the Z-direction). Lz/Lx is larger than 1 and less than 6. Lx is, for example, not less than 3 mm and not more than 12 mm.

Figure 9:
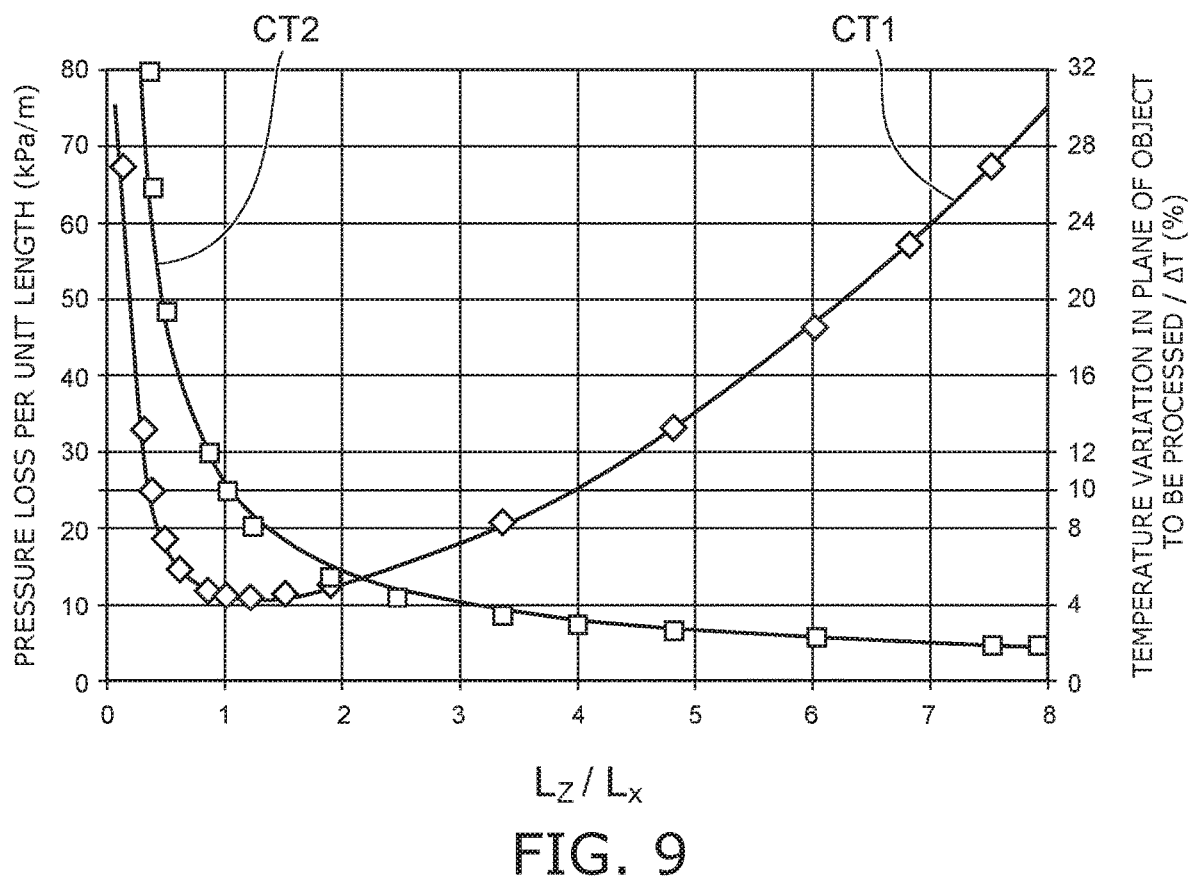
FIG. 9 is a graph view illustrating the relationship between the structure of the electrostatic chuck and the characteristics.

FIG. 9 is a graph view illustrating the relationship between the structure of the electrostatic chuck and the characteristics.

The horizontal axis of FIG. 9 represents a ratio of the height of the communicating passage 55 to the width of the communicating passage 55 (Lz/Lx), namely, an aspect ratio of the communicating passage 55. The aspect ratio is changed assuming that the cross-sectional area of the communicating passage 55 (cross-sectional area in a perpendicular plane to the direction of the cooling medium flow) is constant, in FIG. 8.

The left vertical axis of FIG. 9 represents a pressure loss per unit length (kilopascal/meter: kPa/m) when the cooling medium passes through the communicating passage 55. The characteristics shown in FIG. 8 show the relationship between the pressure loss per unit length and the aspect ratio.

The right vertical axis of FIG. 9 represents the temperature variation in the plane of the objet to be processed/ΔT (%) as well as the vertical axis of FIG. 9. The characteristics CT2 shown in FIG. 9 show the relationship between the temperature variation in the plane of the object to be processed/ΔT and the aspect ratio.

When the aspect ratio (Lz/Lx) becomes large, the in-plane temperature uniformity of the object to be processed W is improved, as shown in the characteristic CT2. Then, for example, the aspect ratio is made larger than 1 in the embodiment. Thereby, the in-plane temperature uniformity of the object to be processed W can be improved and the temperature variation in the plane of the object to be processed/ΔT can be appropriately not more than 10%.

On the other hand, when the aspect ratio (Lz/Lx) becomes larger than 1, the pressure loss per unit length increases, as shown in the characteristic CT1. Then, the aspect ratio is made less than 6 in the embodiment. Thereby, while suppressing the pressure loss from being too large, the in-plane temperature uniformity of the object to be processed W can be improved.

The freedom of disposed pattern of the communicating passage 55 in the X-Y plane is improved by making the width (Lx) of the communicating passage 55 narrow. For example, the communicating passage 55 can be disposed densely. The pressure loss of the cooling medium or the like in the communicating passage 55 can be suppressed by making the height (Lz) of the communicating passage 55 long. From the above, the in-plane temperature uniformity of the object to be processed W can be further improved.

When the thickness (length along the Z-direction) of the base plate 500 is taken as Lbp (mm), the thickness of the communicating passage/the thickness of the base plate (=Lz/Lbp) is favorably not less than 0.1 and not more than 0.9, more favorably not less than 0.2 and not more than 0.8, and further favorably not less than 0.3 and not more than 0.7.

Figure 10:
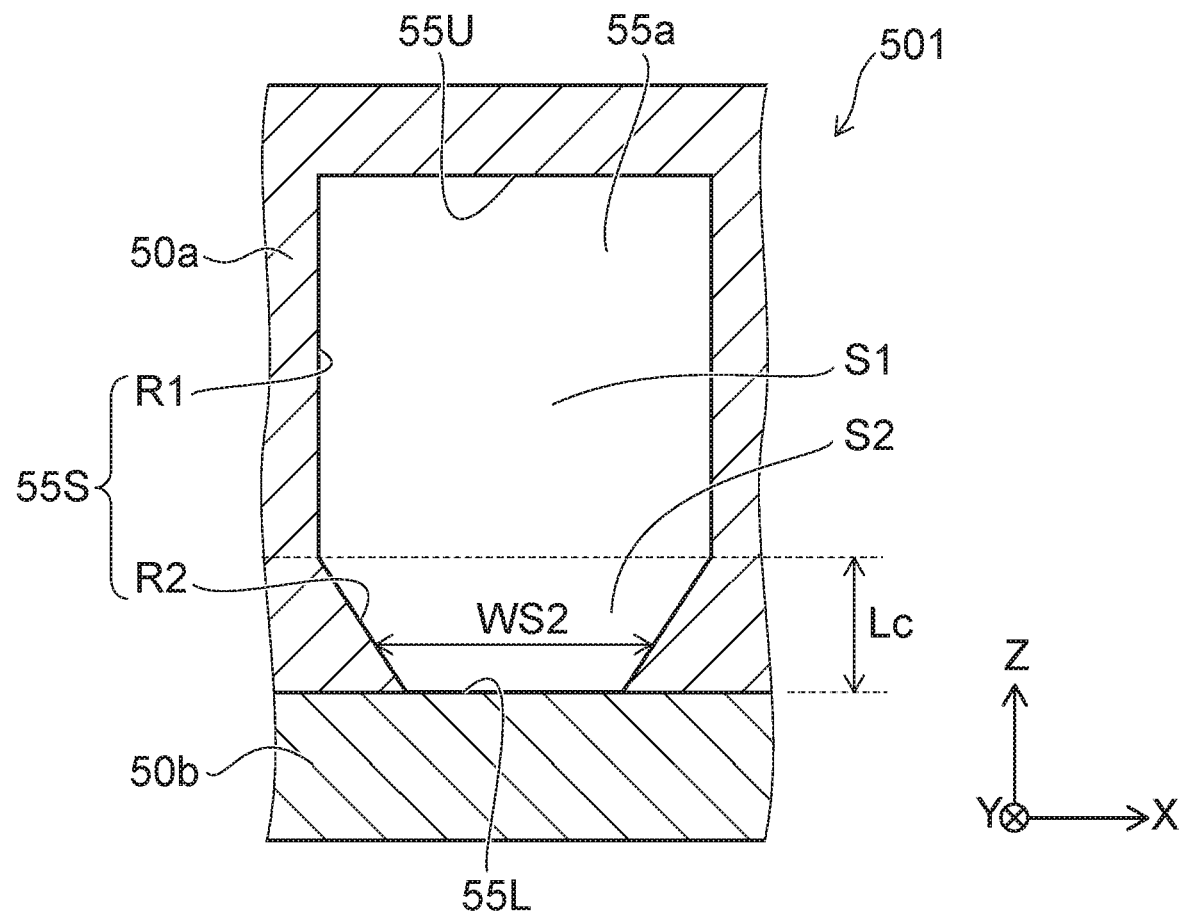
FIG. 10 is a cross-sectional view illustrating a portion of a base plate of another electrostatic chuck according to the embodiment.

FIG. 10 is a cross-sectional view illustrating a portion of a base plate of another electrostatic chuck according to the embodiment.

A base plate 501 shown in FIG. 10 includes a communicating passage 55a in place of the communicating passage 55 described with respect to FIG. 1 to FIG. 7. The communicating passage 55a is different from the communicating passage 55 in the shape of the cross section. Other than this, the base plate 501 shown in FIG. 10 is the same as the base plate 500 described with respect to FIG. 1 to FIG. 8. FIG. 10 shows the cross section in the plane perpendicular to the extension direction of the communicating passage 55a as well as FIG. 3.

As shown in FIG. 10, the side surface 55S of the communicating passage 55 has a first region R1 and a second region R2. The first region R1 is located on a side of the second major surface 11b of the ceramic dielectric substrate 11. The second region R2 is located below the first region R1. In this example, the first region R1 is a region extending substantially parallel to the Z-direction, and the second region R2 is a region tilted with the Z-direction. For example, the second region R2 corresponds to a c-plane (chamfer). A length Lc along the Z-axis direction of the second region R2 is, for example, not less than 0.4 mm and not more than 3.0 mm. When Lc is made longer, the cross-sectional area of the communicating passage decreases, and a flow rate increases. When Lc is made adequately long, the cooling capability is improved, and deformation below the communicating passage is reduced.

The interior of the communicating passage 55 has a first space S1 and a second space S2. The first space S1 is located on a side of the second major surface 11b of the ceramic dielectric substrate 11, and contacts the first region R1 and the upper surface 55U. The second space S2 is located below the first space S1, and contacts the second region R2 and the lower surface 55L. A width WS2 of the second space S2 becomes narrow toward below on both sides due to slope of the second region R2. That is, as it goes downwards, both side surfaces of the communicating passage 55 approaches each other. Thereby, a junction area of the first portion 501 and the second portion 50b can be broad.

The variation of the surface roughness (the maximum height Sz) in the first region R1 (24 points selected on the first region R1 in the flow path) is smaller than the variation of the surface roughness (the maximum height Sz) in the second region R2 (24 points selected on the second region R2 in the flow path). The variation of the surface roughness in the first region R1 is smaller than the variation of the surface roughness in the lower surface 55L. Since the variation of the surface roughness in the first region R1 located above is small, the variation of the heat transfer in the upper portion of the communicating passage 55 can be suppressed. Thereby, the in-plane temperature uniformity of the object to be processed W can be improved.

Since the second region is rough, the turbulent flow is promoted in the lower portion of the communicating passage 55. Thereby, the temperature adjustment effect due to the medium flowing in the communicating passage 55 can be high and the ramp rate can be high.

A method for adjusting the maximum height Sz (μm) in the respective surface includes adjustment of processing condition in forming the first portion 50a and the second portion 50b. For example, the condition of grinding when forming the groove serving as the communicating passage 55 is changed.

The maximum height Sz (μm) may be adjusted by changing the material of which the respective surfaces are formed. The roughness of the upper surface 55U and the roughness of the lower surface 55L can be made different by differentiating the material of the upper surface 55U and the material of the lower surface 55L.

For example, in the case where brazing is used when joining the first portion 50a made of aluminum and the second portion 50b made of aluminum, at least a portion of the lower surface 55L is formed from the brazing filler metal of brazing. The brazing filler metal is, for example, an aluminum alloy including aluminum and an element other than aluminum (silicon, iron and copper or the like). On the other hand, the material of the upper surface 55U is, for example, the same as the material inside the base plate 500 (portion of the base plate 500 not including the communicating passage 55 and the surface of the communicating passage 55). For example, the material of the upper surface 55U is aluminum which is the same as the material of the first portion 50a, and does not include the brazing filler metal. Therefore, a concentration of aluminum (substance quantity per unit volume) in the material of the upper surface 55U is higher than a concentration of aluminum in the material of the lower surface 55L. The variation of the surface roughness of the upper surface 55U can be suppressed by making the material of the upper surface 55U the same as the material inside the base plate 500, and the lower surface 55L can be rough by using the brazing filler metal for the material of the lower surface 55L.

At least a portion of the second region R2 of the side surface 55S is formed from the brazing filler metal. That is, a concentration of aluminum in the material of the first region R1 is higher than a concentration of aluminum in the material of the second region R2.

Figure 11:
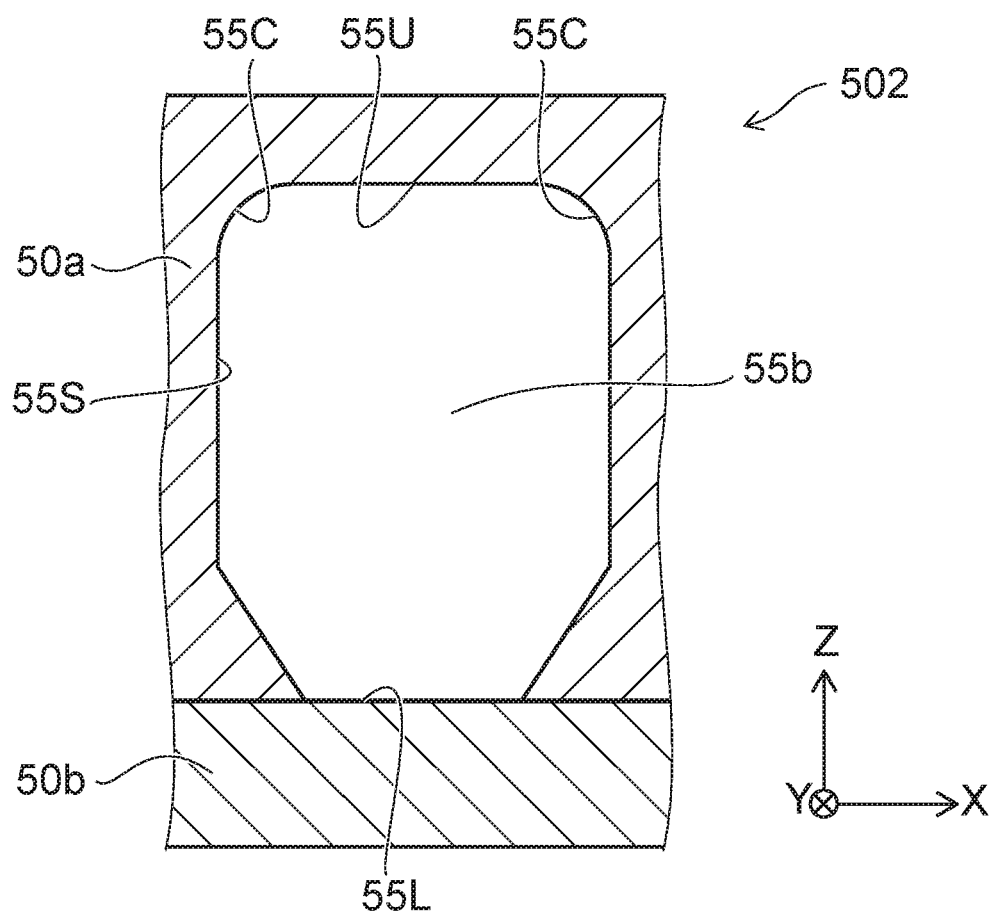
FIG. 11 is a cross-sectional view illustrating a portion of a base plate of another electrostatic chuck according to the embodiment.

FIG. 11 is a cross-sectional view illustrating a portion of a base plate of another electrostatic chuck according to the embodiment.

A base plate 502 shown in FIG. 11 includes a communicating passage 55b in place of the communicating passage 55a described with respect to FIG. 10. The communicating passage 55b is different from the communicating passage 55a in the shape of the cross section. Other than this, the base plate 502 shown in FIG. 11 is the same as the base plate 501 described with respect to FIG. 10. FIG. 11 shows the cross section in the plane perpendicular to the extension direction of the communicating passage 55b as well as FIG. 10.

The communicating passage 55 includes a curved connection portion 55C connecting the upper surface 55U and the side surface 55S. An end of the flow path of the cooling medium is a portion which is influence largely by the turbulent flow (wall turbulence). For example, if the connection portion 55C of the upper surface 55U and the side surface 55S of the communicating passage 55 has a shape bent at a right angle, the influence of the turbulent flow is large at this portion. If the communicating passage 55 has a portion largely influenced by the turbulent flow and a portion slightly influenced by the turbulent flow, the temperature uniformity may be reduced. On the contrary, a difference between the influence of the turbulent flow in the connection portion 55C and the influence of the turbulent flow near the connection portion 55C can be suppressed by making the connection portion 55C of the upper surface 55U and the side surface 55S curved. Thereby, the in-plane temperature uniformity of the object to be processed W can be improved.

Figure 12A:
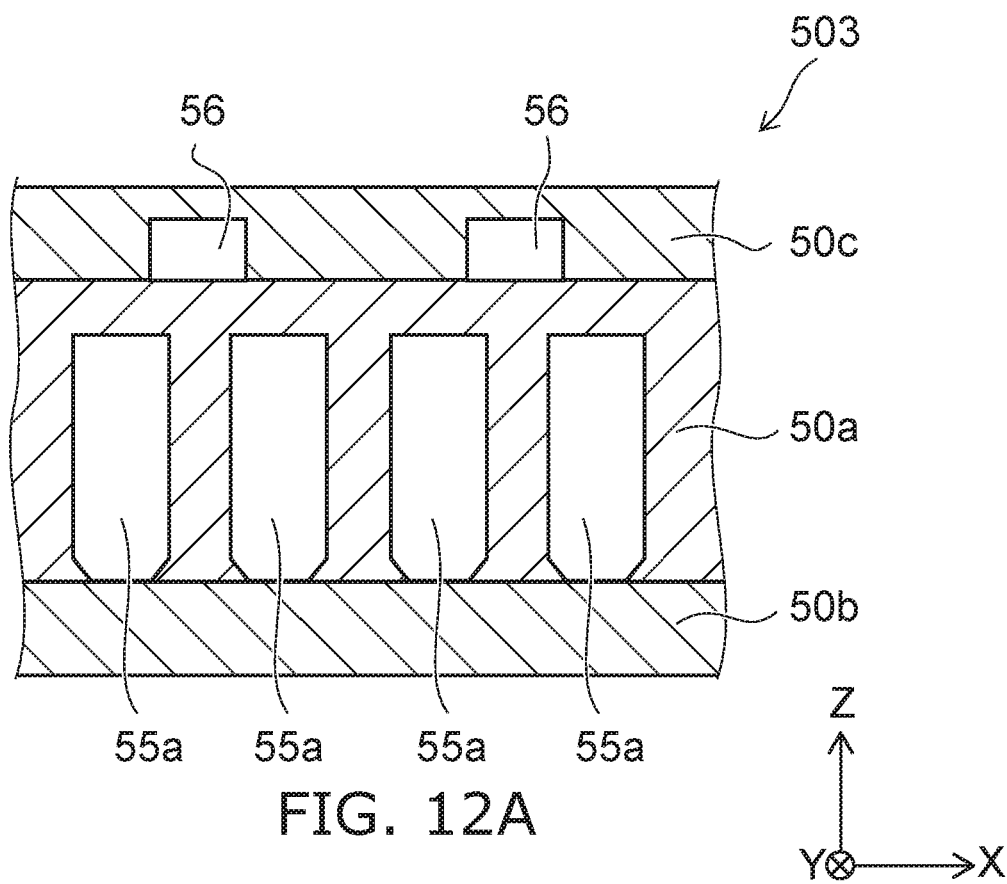
FIG. 12A and FIG. 12B are cross-sectional views illustrating a portion of a base plate of another electrostatic chuck according to the embodiment.
Figure 12B:
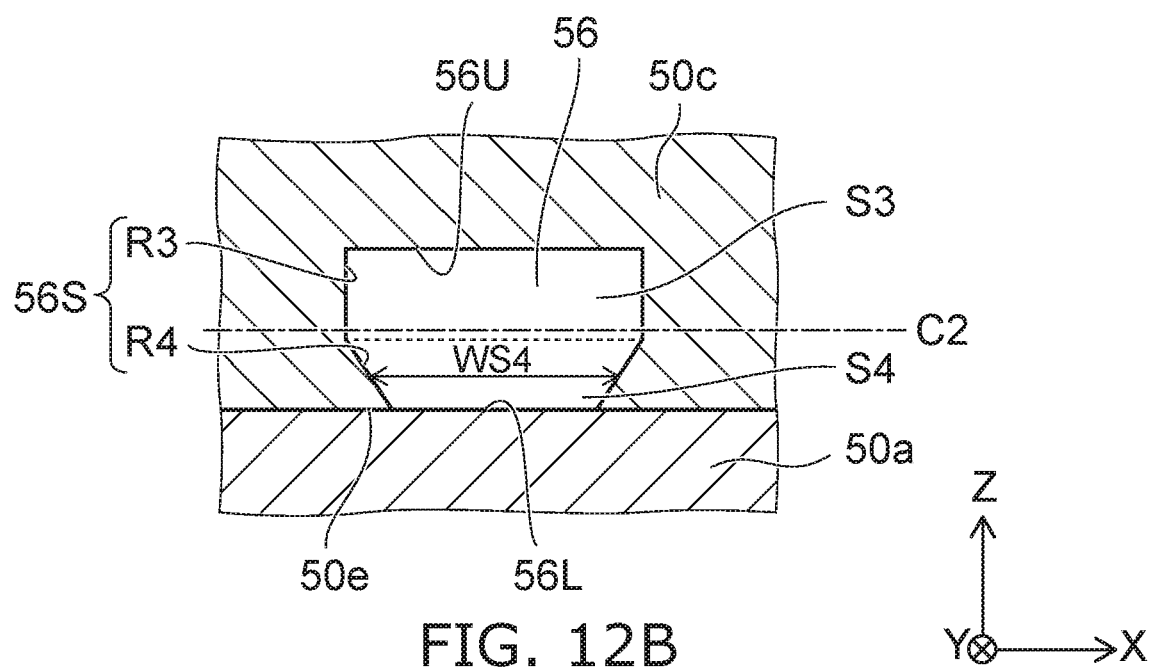

FIG. 12A and FIG. 12B are cross-sectional views illustrating a portion of a base plate of another electrostatic chuck according to the embodiment.

A base plate 503 shown in FIG. 12a includes a third portion 50c and a communicating passage 56 (second communicating passage). Oher than this, the base plate 503 shown in FIG. 12A is the same as the base plate 501 described with respect to FIG. 10. FIG. 12 shows the cross section in the plane similar to the description about FIG. 10.

The third portion 50c is provided above the first portion 50a. That is, the third portion 50c is provided between the first portion 50a and the second major surface 11b of the ceramic dielectric substrate 11.

A material of the third portion 50a can be based on aluminum, for example. The first portion 50a and the third portion 50c are joined by the electron beam welding or the brazing or the like.

The communicating passage 56 is a space formed between the first portion 50a and the third portion 50c. A medium (gas) different from the medium flowing through the communicating passage 55 can be passed in the communicating passage 56. Thereby, the temperature adjustment is performed for the ceramic dielectric substrate 11 and the object to be processed W placed thereon. For example, helium or the like is flown as the cooling medium in the communicating passage 56.

The freedom of the disposed pattern of the region through which the temperature adjustment medium flows is improved by providing the communicating passage 56 in addition to the communicating passage 55. For example, the temperature adjustment medium can be supplied to a predetermined place of the base plate with a predetermined pressure.

FIG. 12 shows the enlarged neighborhood of the communicating passage 56 of FIG. 12A.

As shown in FIG. 12B, the communicating passage 56 has an upper surface 56U, a side surface 56S and a lower surface 56L. The upper surface 56U and the lower surface 56L are surfaces extending along the X-Y plane, respectively, and are separated in the Z-direction each other. The side surface 56A is a surface crossing the X-Y plane, and connects the upper surface 56U and the lower surface 56L.

A junction 50e of the first portion 50a and the second portion 50b is located below the center C2 in the Z-direction of the communicating passage 56. In this example, the upper surface 56U and the side surface 56S are formed of the third portion 50c, and the lower surface 56L is formed of the first portion 50a. That is, the junction 50e is located near the boundary of the side surface 56S and the lower surface 56L. The position of in the Z-direction of the junction 50e is generally the same as the position in the Z-direction of the lower surface 56L.

That is, in this example, the first communicating passage 55a is formed of a recess (opening) provided on the lower surface of the first portion 50a, and the second communicating passage 56 is formed of a recess (opening) provided on the lower surface of the third portion 50c.

When the first portion 50a and the second portion 50b are joined by the electron beam welding or the brazing, the surface of the communicating passage 56 may be rough near the junction. On the contrary, if the junction 50e is placed below the communicating passage 56, the variation of the surface roughness in the upper surface 56U of the communicating passage 56 is suppressed from increasing caused by joining as well as the communicating passage 55 described with respect to FIG. 3.

The side surface 55S of the communicating passage 56 has a third region R3 and a fourth region R4. The third region R3 extends substantially parallel to the Z-direction, and the fourth region R4 is tilted with the Z-direction. The interior of the communicating passage 56 has a third space S3 and a fourth space S4. The third space S3 contacts the third region R3 and the upper surface 56U. The fourth space S4 is located below the third space S3 and contacts the fourth region R4 and the lower surface 56L. A width WS4 of the fourth space S4 is narrowed downward. That is, as it goes downward, both sides of the communicating passage 56 approach each other. Thereby, a junction area of the first portion 50a and the third portion 50c can be broad.

For example, the variation of the surface roughness (the maximum height Sz) in the upper surface 56U (24 points selected on the upper surface 56U in the flow path) is smaller than the variation of the surface roughness (the maximum height Sz) in the lower surface 56L (24 points selected on the lower surface 56L in the flow path), and is smaller than the variation of the surface roughness (the maximum height Sz) in the fourth region R4 (24 points selected on the fourth region R4 in the flow path). The variation of the surface roughness (the maximum height Sz) in the third region R3 (24 points selected on the third region R3 in the flow path) is smaller than the variation of the surface roughness in the fourth region R4. Thereby, the in-plane temperature uniformity of the object to be processed W and the ramp rate can be improved as well as the description about the communication passage 55. The maximum height Sz (μm) of the respective surfaces can be adjusted by condition of grinding and joining as well as the description about the communicating passage 55.

Figure 13:
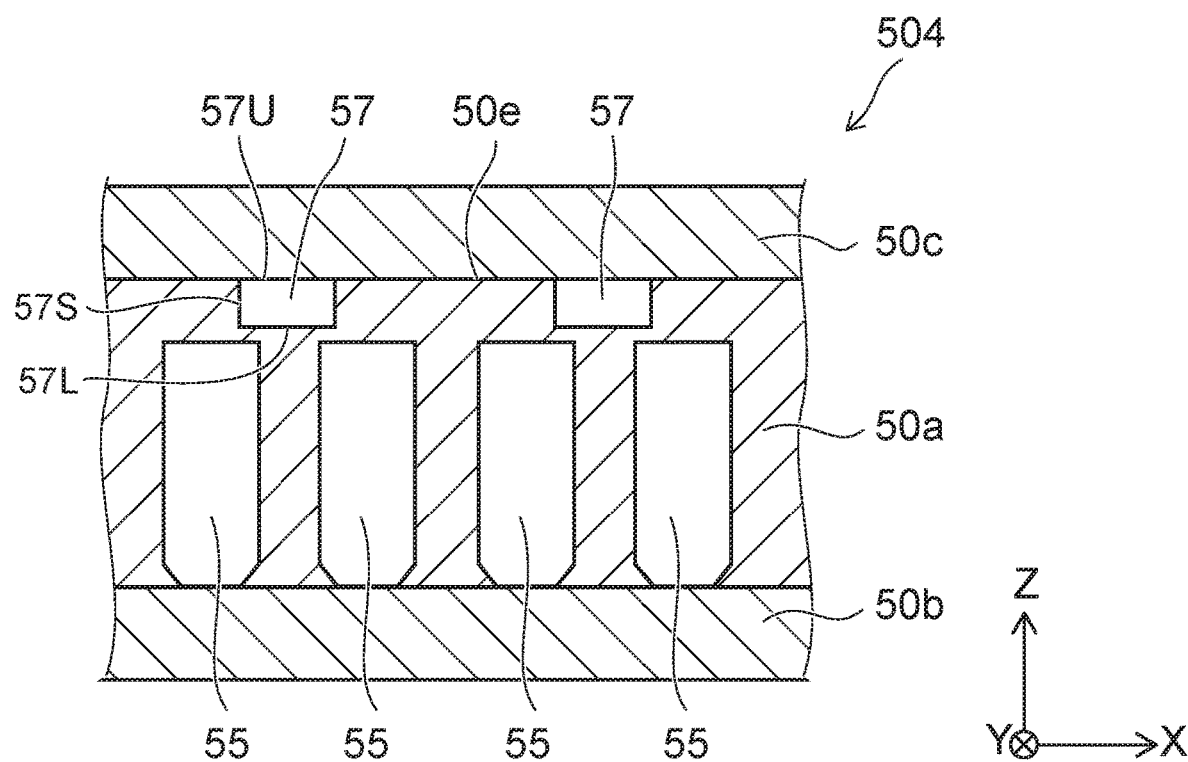
FIG. 13 is a cross-sectional view illustrating a portion of a base plate of another electrostatic chuck according to the embodiment.

FIG. 13 is a cross-sectional view illustrating a portion of a base plate of another electrostatic chuck according to the embodiment.

A base plate 504 shown in FIG. 13 includes a communicating passage 57 (second communicating passage) in place of the communicating passage 56. Other than this, the base plate 504 is similar to the base plate 503 described with respect to FIG. 12.

The communicating passage 57 is a space between the first portion 50a and the third portion 50c joined each other by brazing or the like as well as the communicating passage 56. The medium (gas) for adjusting the temperature of the object to be processed W is passed through the communicating passage 57.

The communicating passage 57 has an upper surface 57U, a side surface 57s, and the lower surface 57L. In this example, the upper surface 57U is formed of the third portion 50c, and the side surface 57S and the lower surface 57L are formed of the first portion 50a. That is, the junction 50e of the first portion 50a and the third portion 50c is located near the boundary of the side surface 57S and the upper surface 57U. The position in the Z-direction of the junction 50e and the position in the Z-direction of the upper surface 57U are substantially the same. In this way, the junction 50e of the first portion 50a and the third portion 50c may be located above the center in the Z-direction of the second communicating passage (communicating passage 57).

Figure 14:
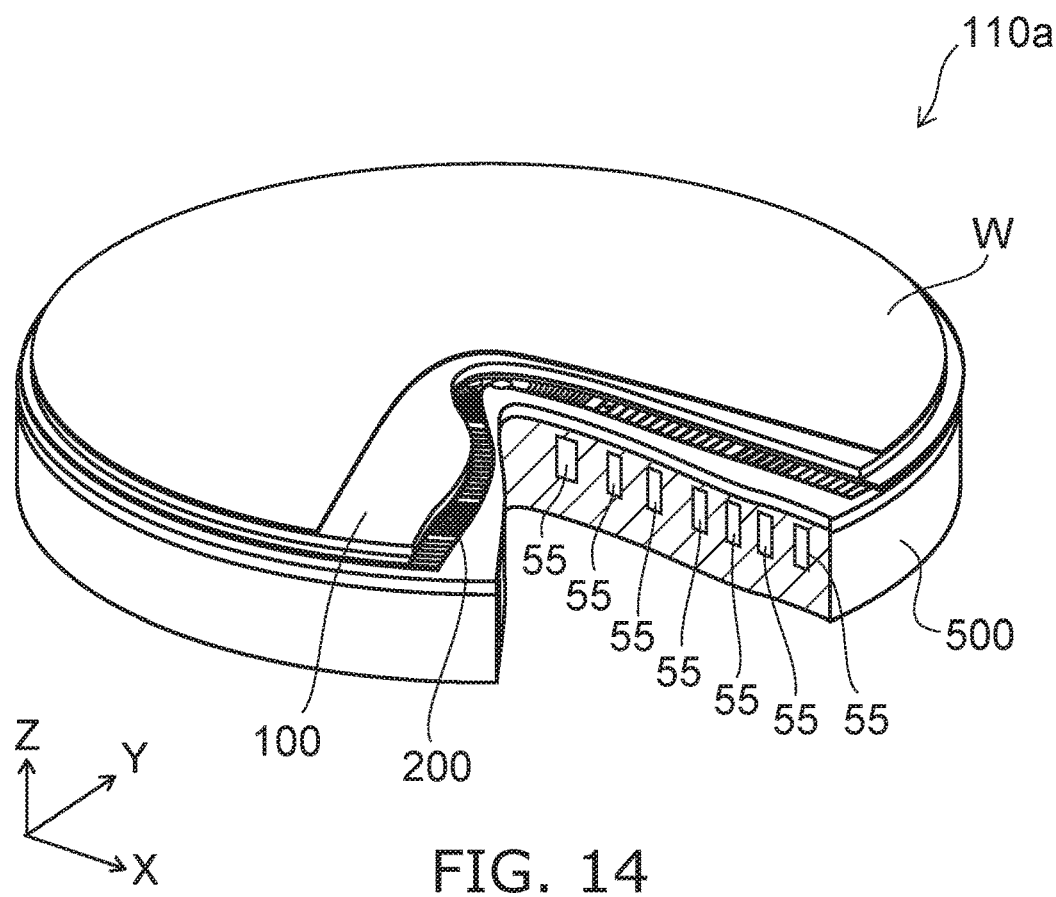
FIG. 14 is a perspective view illustrating another electrostatic chuck according to the embodiment.

FIG. 14 is a perspective view illustrating another electrostatic chuck according to the embodiment.

FIG. 14 shows the cross section of a portion of the electrostatic chuck in convenience of description. An electrostatic chuck 110a shown in FIG. 14 includes a heater plate 200. Other than this, the electrostatic chuck 110a is the same as the electrostatic chuck described previously.

The heater plate 200 is provided between the base plate 500 and the electrostatic chuck substrate 100. For example, an adhesive is provided between the base plate 500 and the heater plate 200. The adhesive is provided between the heater plate and the electrostatic chuck substrate 100. A material of the adhesive includes, for example, a heat resistant resin such as silicone or the like having relatively high thermal conductivity. The heater plate 200 generates heat due to flow of a heater current, and can increase the temperature of the object to be processed W in comparison with the case of no heat generation of the heater plate 200. The base plate 500 may be one of the base plates 501 to 504 described previously. The heater not shown is also possible to be built-in the base plate 500.

For example, the temperature of the object to be processed W can be controlled by cooling the heat of the heater plate 200 by a refrigerant flowing in the communicating passage 55 in the base plate 500. That is, the temperature of the ceramic dielectric substrate 11 and the object to be processed W is controlled by exchange of heat between the heater plate 200 and the base plate 500. Since the base plate 500 cools the heater plate 200 provided thereon, the temperature of the object to be processed W depends on uniformity of heat transfer on the upper surface of the communicating passage 55.

In this way, also in the case where the heater plate 200 is provided, the uniformity of the temperature distribution of the object to be processed W can be improved by controlling the shape of the communicating passage (the communicating passages 55, 55a, 55b, 56, 57) in the base plate as well as the description about the base plates 500 to 504 described previously. The ramp rate can be high.

Hereinabove, embodiments of the invention are described. However, the inventions are not limited to these descriptions. Any design change in the above embodiments suitably made by those skilled in the art is also encompassed within the scope of the invention as long as the feature of the invention is included. For example, shapes, the dimension, the material, the disposition, the installation form or the like included in the ceramic dielectric substrate and the base plate are not limited to illustrations and can be changed appropriately.

What is claimed is:
1. An electrostatic chuck, comprising:
a ceramic dielectric substrate having a first major surface placing an object to be processed and a second major surface on an opposite side of the first major surface; and
a base plate provided on a side of the second major surface and supporting the ceramic dielectric substrate,
the base plate including a first communicating passage for passing a medium which adjusts a temperature of the object to be processed,
the first communicating passage having an upper surface, a side surface, and a lower surface,
wherein a ratio of variation of a maximum height Sz in the upper surface to a height of the first communicating passage is not more than 1%,
and wherein the variation of the maximum height Sz in the upper surface, a variation of a maximum height Sz in the side surface, and a variation of a maximum height Sz in the lower surface are different from one another.

2. The electrostatic chuck according to claim 1, wherein:
the base plate includes a first portion on a side of the second major surface, and a second portion provided below the first portion and joined to the first portion,
and a junction of the first portion and the second portion is located below a center in a vertical direction of the first communicating passage.

3. The electrostatic chuck according to claim 1, wherein the variation of the maximum height Sz in the upper surface is smaller than the variation of the maximum height Sz in the side surface.

4. The electrostatic chuck according to claim 1, wherein the variation of the maximum height Sz in the upper surface is smaller than the variation of the maximum height Sz in the lower surface.

5. The electrostatic chuck according to claim 1, wherein the side surface includes
a first region on a side of the second major surface, and a second region located below the first region,
variation of a maximum height Sz in the first region is smaller than variation of a maximum height Sz in the second region.

6. The electrostatic chuck according to claim 1, wherein the side surface includes
a first region on a side of the second major surface, and a second region located below the first region,
variation of a maximum height Sz in the first region is smaller than variation of a maximum height Sz in the lower surface.

7. The electrostatic chuck according to claim 1, wherein the side surface includes
a first region on a side of the second major surface, and a second region located below the first region,
a concentration of aluminum in a material of the first region is higher than a concentration of aluminum in a material of the second region.

8. The electrostatic chuck according to claim 1, wherein one of the lower surface and a region below the side surface is a turbulent flow promotion portion.

9. The electrostatic chuck according to claim 1, wherein a material of the upper surface is same as a material inside the base plate.

10. The electrostatic chuck according to claim 1, wherein the height of the first communicating passage is longer than a width of the first communicating passage.

11. The electrostatic chuck according to claim 10, wherein a ratio of the height of the first communicating passage to the width of the first communicating passage is larger than 1 and less than 6.

12. The electrostatic chuck according to claim 1, wherein a ratio of a distance between an upper surface on the second major surface side of the base plate and the upper surface of the first communicating passage to the height of the first communicating passage is not less than 0.1 and not more than 10.

13. The electrostatic chuck according to claim 1, wherein the first communicating passage further includes a curved connection portion connecting the upper surface and the side surface.

14. The electrostatic chuck according to claim 1, wherein the first communicating passage includes
a first space on a side of the second major surface, and a second space below the first space,
a width of the second space becomes narrow toward below.

15. The electrostatic chuck according to claim 1, wherein the base plate includes
a first portion,
a third portion provided above the first portion and joined to the first portion, and
a second communicating passage provided between the first portion and the third portion, the second communicating passage passing a gas medium different from a medium flowing through the first communicating passage,
the second communicating passage is provided on a side of the second major surface from the first communicating passage.

16. The electrostatic chuck according to claim 15, wherein
a junction of the first portion and the third portion is located below a center in a vertical direction of the second communicating passage,
the second communicating passage includes
a third space on a side of the second major surface, and a fourth space below the third space,
a width of the fourth space becomes narrow toward below.

17. The electrostatic chuck according to claim 15, wherein
the base plate further includes
a third portion provided above the first portion and joined to the first portion, and
a second communicating passage provided between the first portion and the third portion, a gas medium flowing through the second communicating passage,
a junction of the first portion and the third portion is located below a center in a vertical direction of the second communicating passage.

18. An electrostatic chuck, comprising:
a ceramic dielectric substrate having a first major surface placing an object to be processed and a second major surface on an opposite side of the first major surface; and
a base plate provided on a side of the second major surface and supporting the ceramic dielectric substrate, the base plate being made of a metal,
the base plate including a first communicating passage passing a medium which adjusts a temperature of the object to be processed, the first communicating passage having an upper surface, a side surface, and a lower surface, and variation of a maximum height Sz in the upper surface being smaller than variation of a maximum height Sz in the side surface.

19. The electrostatic chuck according to claim 18, wherein a ratio of the variation of the maximum height Sz in the upper surface to a height of the first communicating passage is not more than 1%.

20. An electrostatic chuck, comprising:
a ceramic dielectric substrate having a first major surface placing an object to be processed and a second major surface on an opposite side of the first major surface; and
a base plate provided on a side of the second major surface and supporting the ceramic dielectric substrate,
the base plate including a first communicating passage for passing a medium which adjusts a temperature of the object to be processed,
the first communicating passage having an upper surface, a side surface, and a lower surface,
wherein a ratio of variation of a maximum height Sz in the upper surface to a height of the first communicating passage is not more than 1%,
and wherein a material of the upper surface and a material of the lower surface are different from each other.

21. The electrostatic chuck according to claim 20, wherein
a concentration of aluminum in the material of the upper surface is higher than a concentration of aluminum in the material of the lower surface.

* * * * *